US012647696B2

(12) United States Patent
Liu et al.

(10) Patent No.: US 12,647,696 B2
(45) Date of Patent: Jun. 2, 2026

(54) PIXEL CIRCUIT SELECTING TO OUTPUT TIME DIFFERENCE DATA OR IMAGE DATA

(71) Applicant: PixArt Imaging Inc., Hsin-Chu County (TW)

(72) Inventors: Ren-Chieh Liu, Hsin-Chu County (TW); Yi-Cheng Chiu, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 111 days.

(21) Appl. No.: 18/898,062

(22) Filed: Sep. 26, 2024

(65) Prior Publication Data

US 2025/0024172 A1      Jan. 16, 2025

Related U.S. Application Data

(60) Division of application No. 18/235,370, filed on Aug. 18, 2023, now Pat. No. 12,137,295, which is a division of application No. 17/395,527, filed on Aug. 6, 2021, now Pat. No. 11,812,176, which is a continuation-in-part of application No. 17/009,417, filed on Sep. 1, 2020, now Pat. No. 11,290,671.

(51) Int. Cl.
| | |
|---|---|
| *H04N 25/767* | (2023.01) |
| *H04N 25/771* | (2023.01) |
| *H10F 39/00* | (2025.01) |
| *H10F 39/18* | (2025.01) |

(52) U.S. Cl.
CPC ......... *H04N 25/767* (2023.01); *H04N 25/771* (2023.01); *H10F 39/18* (2025.01); *H10F 39/8037* (2025.01)

(58) Field of Classification Search
CPC .... H04N 25/767; H04N 25/771; H04N 25/77; H04N 25/00; H04N 25/58; H04N 25/47; H04N 25/62; H10F 39/18; H10F 39/8037
See application file for complete search history.

(56) References Cited

U.S. PATENT DOCUMENTS

| | | | |
|---|---|---|---|
| 6,366,317 B1 | 4/2002 | Mattison et al. | |
| 11,050,961 B2 * | 6/2021 | Nie | H04N 25/768 |
| 11,546,540 B2 | 1/2023 | Liu et al. | |
| 2007/0241258 A1 * | 10/2007 | Altice | H04N 25/76 348/E3.018 |
| 2011/0054583 A1 | 3/2011 | Litt et al. | |
| 2011/0304757 A1 | 12/2011 | Egawa | |
| 2014/0263950 A1 * | 9/2014 | Fenigstein | H04N 25/77 250/208.1 |
| 2016/0219239 A1 * | 7/2016 | Itoh | H04N 25/709 |
| 2017/0353675 A1 | 12/2017 | Onuki et al. | |
| 2018/0167575 A1 | 6/2018 | Watanabe | |

(Continued)

*Primary Examiner* — Albert H Cutler
(74) *Attorney, Agent, or Firm* — WPAT, PC

(57) ABSTRACT

There is provided a pixel circuit capable of outputting time difference data or image data, and including a first temporal circuit and a second temporal circuit. The first temporal circuit is used to store detected light energy of a first interval and a second interval as the time difference data. The second temporal circuit is used to store detected light energy of the second interval as the image data. The pixel circuit is used to output a pulse width signal corresponding to the time difference data or the image data in different operating modes.

20 Claims, 20 Drawing Sheets

1200

2a                2b

(56)         References Cited

U.S. PATENT DOCUMENTS

| 2019/0026901 | A1 | 1/2019 | Fu |
| 2022/0109799 | A1 | 4/2022 | Niwa |
| 2025/0014337 | A1 | 1/2025 | Goodman |

* cited by examiner mode I mode II mode III time difference

PIXEL CIRCUIT SELECTING TO OUTPUT TIME DIFFERENCE DATA OR IMAGE DATA

CROSS REFERENCE TO RELATED APPLICATION

The present application is a divisional application of U.S. patent application Ser. No. 18/235,370 filed on, Aug. 18, 2023, which is a divisional application of U.S. patent application Ser. No. 17/395,527 filed on, Aug. 6, 2021, which is a continuation-in-part application of U.S. patent application Ser. No. 17/009,417 filed on, Sep. 1, 2020, the disclosures of which are hereby incorporated by reference herein in their entirety.

To the extent any amendments, characterizations, or other assertions previously made (in this or in any related patent applications or patents, including any parent, sibling, or child) with respect to any art, prior or otherwise, could be construed as a disclaimer of any subject matter supported by the present disclosure of this application, Applicant hereby rescinds and retracts such disclaimer. Applicant also respectfully submits that any prior art previously considered in any related patent applications or patents, including any parent, sibling, or child, may need to be re-visited.

BACKGROUND

1. Field of the Disclosure

This disclosure generally relates to a pixel structure and, more particularly, to a pixel circuit capable of selecting to output a pulse width signal corresponding to time difference data and image data.

2. Description of the Related Art

Nowadays, the optical sensor outputs voltage values to be converted to a digital image frame by an analog-to-digital converter, and then a processor of the optical sensor performs the following operation using the digital image frame, e.g., calculating displacement or performing motion detection.

However, in an optical sensor performing the operation in a digital backend thereof, the digital backend generally needs frame buffers to store the whole digital image frame. Generally, the optical sensor needs two frame buffers to store pixel data.

Accordingly, it is necessary to provide a pixel structure that performs various operations on pixel data at analog phase.

SUMMARY

The present disclosure provides a pixel circuit that represents detected light intensity using a pulse width, and performs the pixel-wise operation, including intra-pixel and inter-pixel operations, using pulse width signals.

The present disclosure provides an operating method of a pixel circuit. The pixel circuit includes a photodiode, a transfer transistor, a first node configured to store light energy from the photodiode via the transfer transistor; a first temporal circuit including a first capacitor having a first end coupled to the first node and a second end coupled to a second node in the first temporal circuit, and a second temporal circuit including a second capacitor having a first end coupled to the first node and a second end coupled to a third node in the second temporal circuit. The operation method includes the steps of: exposing the photodiode and resetting the first node and the second node in a first interval; transferring first light energy generated by the photodiode in the first interval to the first node via the transfer transistor in a second interval to cause the first node to have a first voltage offset; exposing the photodiode, resetting the first node and floating the first capacitor in a third interval to cause the second node to be increased by the first voltage offset; transferring second light energy generated by the photodiode in the third interval to the first node via the transfer transistor in a fourth interval to cause the first node to have a second voltage offset and cause the second node to be further decreased by the second voltage offset; and resetting the first node and floating the second capacitor in a fifth interval to cause the third node to be increased by the second voltage offset.

The present disclosure further provides an operating method of a pixel circuit. The pixel circuit includes a photodiode, a transfer transistor, a first node configured to store light energy from the photodiode via the transfer transistor; a first temporal circuit including a first capacitor having a first end coupled to the first node and a second end coupled to a second node in the first temporal circuit, and a second temporal circuit including a second capacitor having a first end coupled to the first node and a second end coupled to a third node in the second temporal circuit. The operation method includes the steps of: exposing the photodiode and resetting the first node and the second node in a first interval; transferring first light energy generated by the photodiode in the first interval to the first node via the transfer transistor in a second interval to cause the first node to have a first voltage offset; exposing the photodiode, resetting the first node and floating the first capacitor in a third interval to cause the second node to be increased by the first voltage offset; transferring second light energy generated by the photodiode in the third interval to the first node via the transfer transistor in a fourth interval to cause the first node to have a second voltage offset and cause the second node to be further decreased by the second voltage offset; and controlling the first temporal circuit to output a pulse width signal corresponding to a difference between the first light energy and the second light energy in a fifth interval.

The present disclosure further provides an operating method of a pixel circuit. The pixel circuit includes a photodiode, a transfer transistor, a first node configured to store light energy from the photodiode via the transfer transistor; a first temporal circuit including a first capacitor having a first end coupled to the first node and a second end coupled to a second node in the first temporal circuit, and a second temporal circuit including a second capacitor having a first end coupled to the first node and a second end coupled to a third node in the second temporal circuit. The operation method includes the steps of: exposing the photodiode and resetting the first node and the second node in a first interval; transferring first light energy generated by the photodiode in the first interval to the first node via the transfer transistor in a second interval to cause the first node to have a first voltage offset; exposing the photodiode, resetting the first node and floating the first capacitor in a third interval to cause the second node to be increased by the first voltage offset; transferring second light energy generated by the photodiode in the third interval to the first node via the transfer transistor in a fourth interval to cause the first node to have a second voltage offset and cause the second node to be further decreased by the second voltage offset; and identifying whether to read the third node of the second temporal circuit according to a voltage on the second node of the first temporal circuit.

The temporal circuit of the present disclosure is used to store detected light energy of different time intervals and to output detection signals of different pulse widths, wherein the pulse width is positively related to the detected light energy.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The present disclosure is related to a pixel circuit that performs pixel-wise analog operation. Every pixel outputs a detection signal having a pulse width corresponding to detected light energy. An operation circuit is used to perform the analog operation on the pulse width (PW) signals. The voltage value after the analog operation is further converted to a PW signal using a voltage-temporal conversion circuit at first and then a next analog operation is performed by the same or by another operation circuit. In this way, all data operation is accomplished in the analog phase without being converted to digital data at first.

Figure 1:
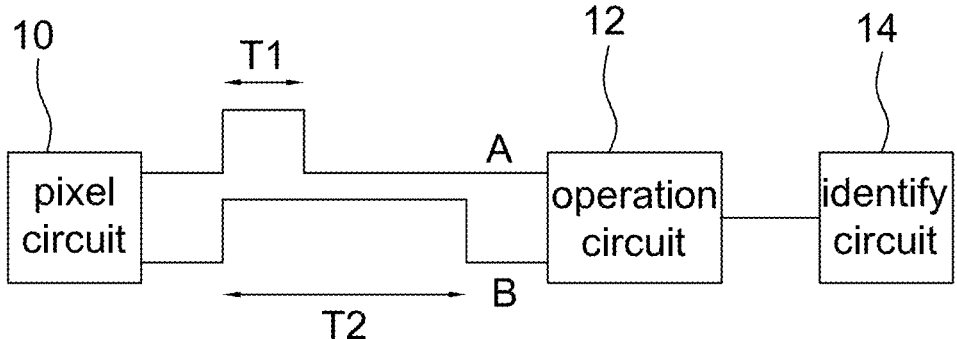
FIG. 1 is a schematic block diagram of a pixel structure of an optical sensor according to one embodiment of the present disclosure.

Referring to FIG. 1, it is a schematic block diagram of a pixel structure of an optical sensor (e.g., CMOS image sensor) according to one embodiment of the present disclosure. The pixel structure includes a pixel circuit 10 and an operation circuit 12. The pixel circuit 10 is used to output detection signals of different time intervals, e.g., signals A and B in FIG. 1 indicating different detection signals detected within different time intervals. In the present disclosure, the detection signals A and B respectively indicate magnitude of light energy detected by the pixel circuit 10 using pulse widths T1 and T2, wherein when the detected light energy is larger, the pulse width of the corresponding detection signals A or B is longer.

Figure 5:
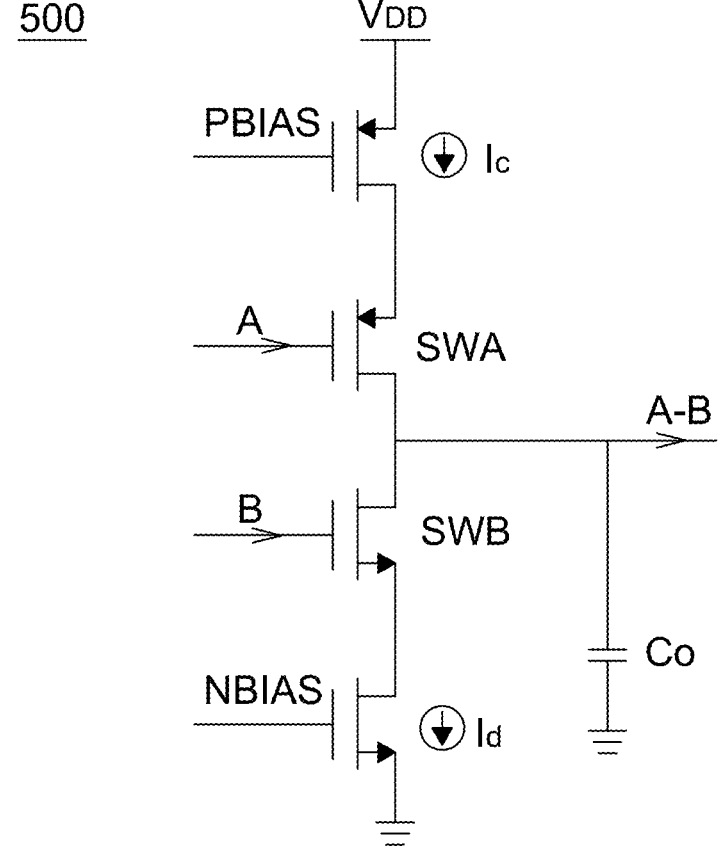
FIG. 5 is a circuit diagram of a subtraction circuit of a pixel circuit according to one embodiment of the present disclosure.
Figure 6:
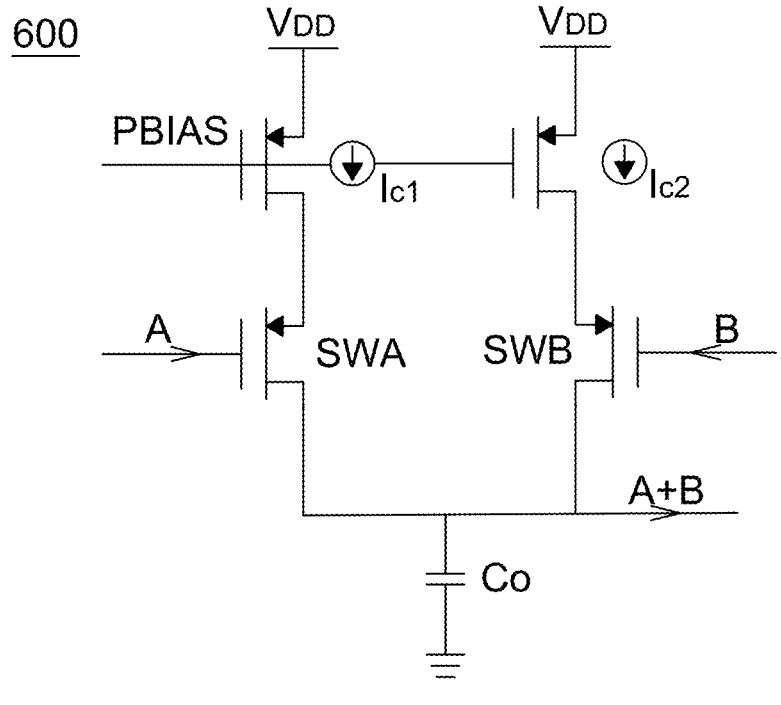
FIG. 6 is a circuit diagram of an addition circuit of a pixel circuit according to one embodiment of the present disclosure.
Figure 7:
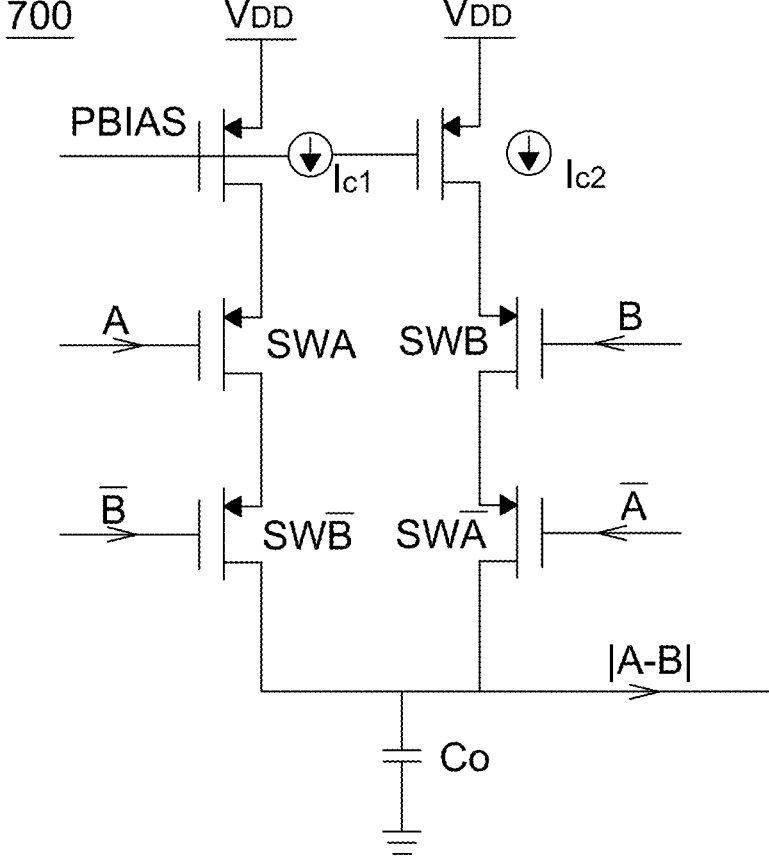
FIG. 7 is a circuit diagram of an absolute difference circuit of a pixel circuit according to one embodiment of the present disclosure.

The operation circuit 12 includes any circuit used to perform the operation between signals, e.g., described by a subtraction circuit in FIG. 5, an addition circuit in FIG. 6 and an absolute difference circuit in FIG. 7 herein, but not limited thereto. In a pixel array including multiple pixels, the operation circuit 12 is arranged inside each pixel to process data in the pixel or arranged between pixels to process data between pixels.

In some aspects, the pixel structure further includes an identify circuit 14. The identify circuit 14 includes, for example, a comparator for comparing the output result of the operation circuit 21 with a predetermined threshold so as to identify an operating state of a device adopting the pixel structure of the present disclosure. For example, when the pixel structure of the present disclosure is adapted to a mouse device, the identify circuit 14 is used to identify whether the mouse device is lifted up by a user. The output result of the operation circuit 12 indicates a brightness variation. When the identify circuit 14 identifies that the brightness variation is larger than or smaller than a brightness threshold, the mouse device is identified to be lifted by the user. The identify circuit 14 then outputs a control signal to perform corresponding controls, e.g., turning off the light source and/or not outputting displacement signals, but not limited to.

Figure 2:
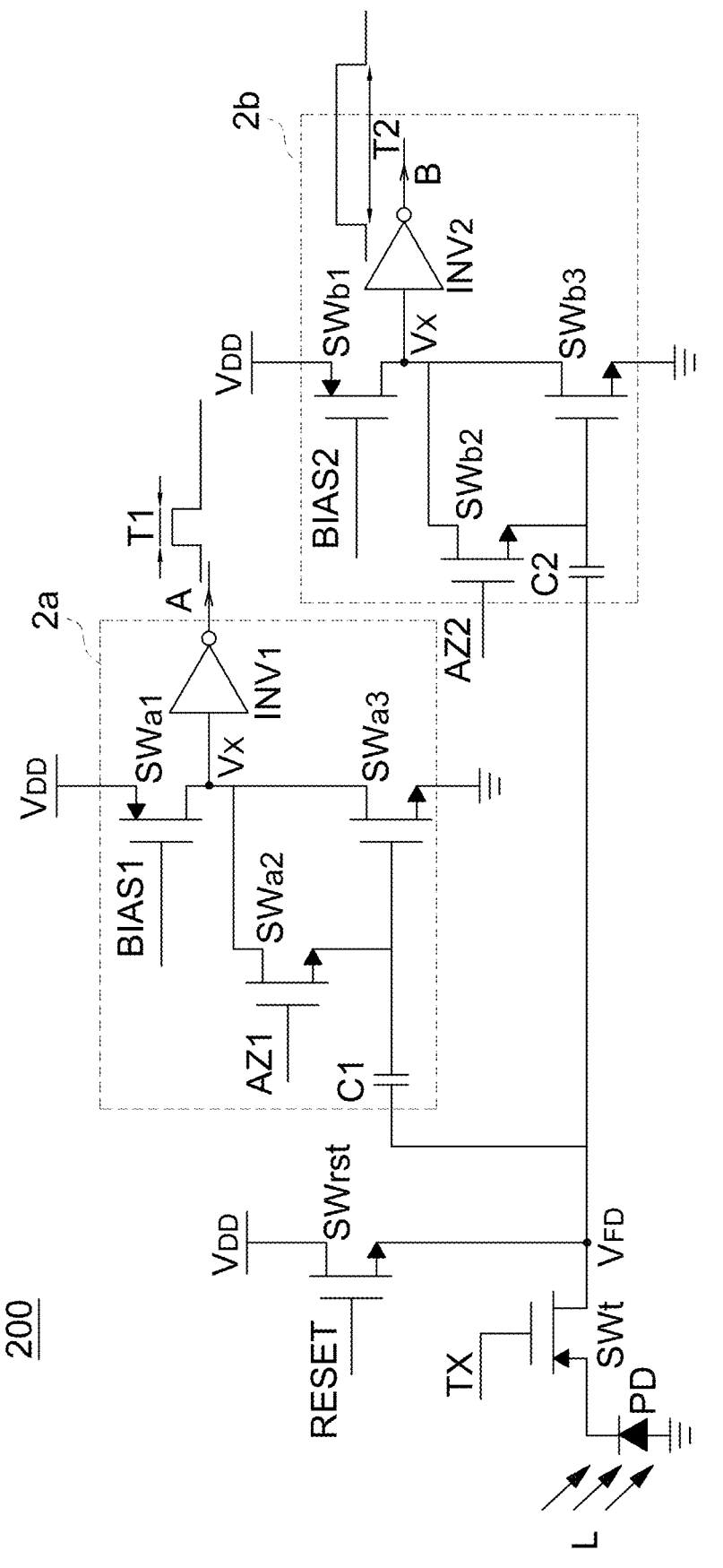
FIG. 2 is a circuit diagram of a pixel circuit according to one embodiment of the present disclosure.

Please referring to FIG. 2, it is a circuit diagram of a pixel circuit 200 according to one embodiment of the present disclosure. The pixel circuit 200 is used to output pulse width (PW) signals A and B, i.e. detection signals. The pixel circuit 200 includes a photodiode PD, a transfer transistor SWt, a reset transistor SWrst, a first temporal circuit 2a and a second temporal circuit 2b all connected to a node $V_{FD}$.

The photodiode PD is used to generate light energy according to the light L being received. The light energy is respectively stored in the first temporal circuit 2a and the second temporal circuit 2b within different time intervals (e.g., controlled by a control signal TX). In the present disclosure, in addition to storing light energy detected within different time intervals, the first temporal circuit $2a$ and the second temporal circuit $2b$ further respectively convert the stored light energy into detection signals A and B having corresponding pulse widths (e.g., T1 and T2) for the operation circuit $12$ to perform analog operation. The first temporal circuit $2a$ and the second temporal circuit $2b$ have identical circuit arrangement only being operated within different time intervals.

Figure 4A:
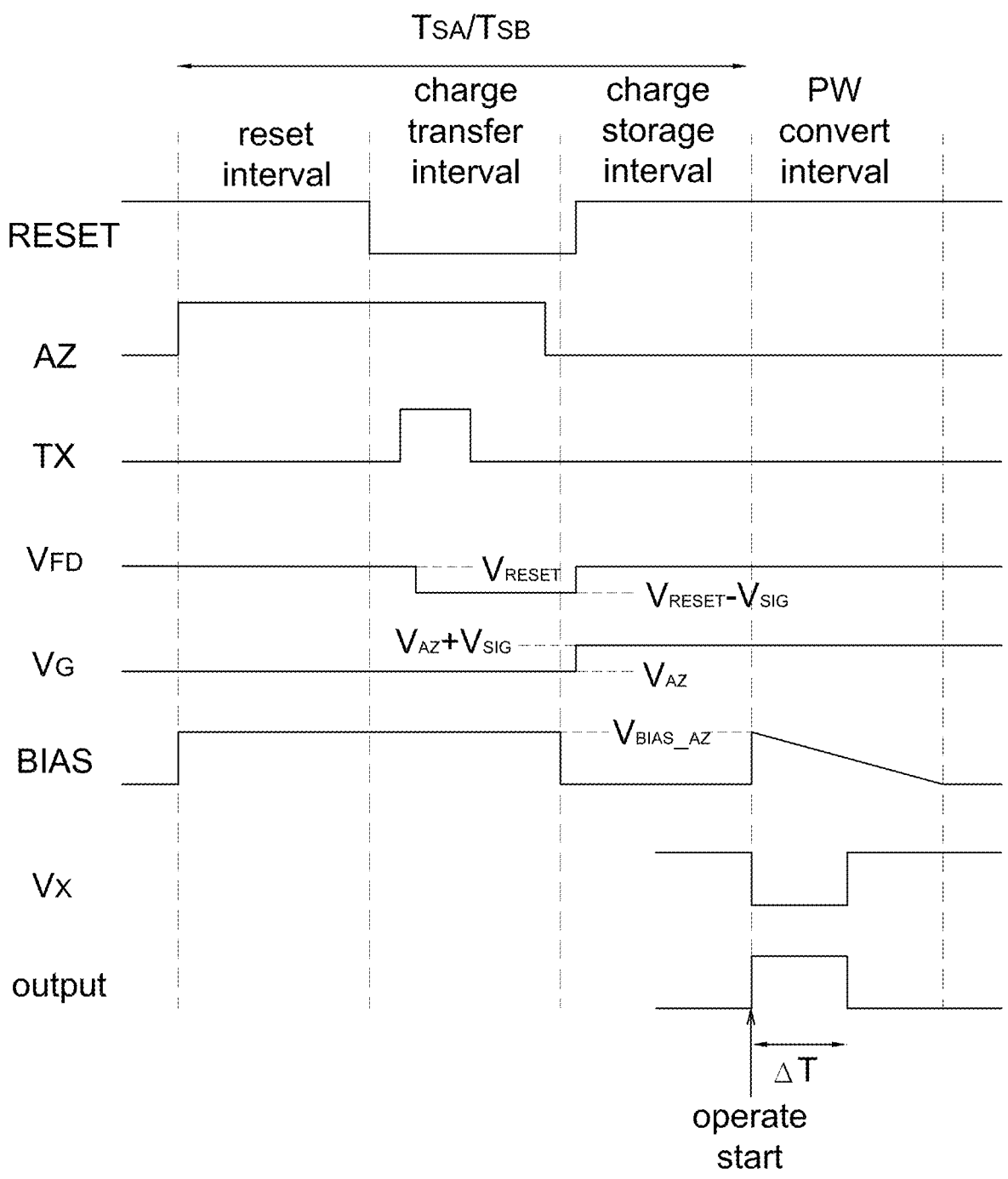
FIG. 4A is an operational timing diagram of the temporal circuit in FIG. 3.
Figure 4B:
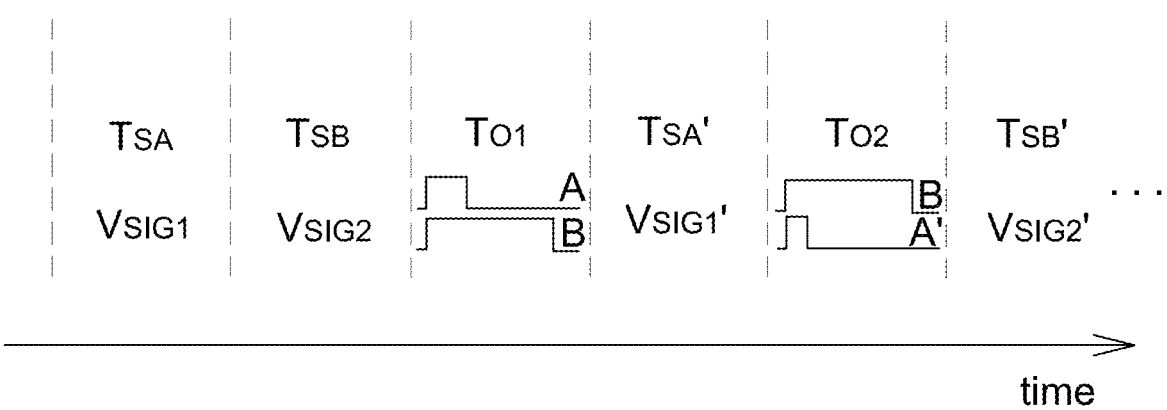
FIG. 4B is an operational timing diagram of the pixel circuit in FIG. 2.

The first temporal circuit $2a$ stores first light energy (e.g., referring to $V_{SIG1}$ shown in FIG. 4B), generated by the photodiode PD within a first interval (e.g., referring to $T_{SA}$ shown in FIG. 4B), and outputs a first detection signal A having a first pulse width T1 according to the first light energy $V_{SIG1}$ within an operation interval (e.g., referring to $T_{O1}$ shown in FIG. 4B).

The second temporal circuit $2b$ stores second light energy (e.g., referring to $V_{SIG2}$ shown in FIG. 4B) generated by the photodiode PD within a second interval (e.g., referring to $T_{SB}$ shown in FIG. 4B), and outputs a second detection signal B having a second pulse width T2 according to the second light energy $V_{SIG2}$ within the operation interval $T_{O1}$. It is appreciated that lengths of T1 and T2 in drawings are only intended to illustrate but not to limit the present disclosure.

The reset transistor SWrst is coupled between a voltage source $V_{DD}$ and the node $V_{FD}$, and used to reset the first temporal circuit $2a$ in the first interval $T_{SA}$ and reset the second temporal circuit $2b$ in the second interval $T_{SB}$.

The transfer transistor SWt is coupled between the photodiode PD and the node $V_{FD}$, and used to transfer the first light energy $V_{SIG1}$ to be stored into the first temporal circuit $2a$ in the first interval $T_{SA}$ and transfer the second light energy $V_{SIG2}$ to be stored into the second temporal circuit $2b$ in the second interval $T_{SB}$. In this way, the pixel circuit $200$ stores detected light energy of different time intervals to indicate the variation of detected light with time.

In some aspects, the first temporal circuit $2a$ further includes a first inverter INV1 coupled between an output terminal of the first temporal circuit $2a$ and the operation circuit $12$, and the first inverter INV1 is used to invert a phase of the first detection signal A; the second temporal circuit $2b$ further includes a second inverter INV2 coupled between an output terminal of the second temporal circuit $2b$ and the operation circuit $12$, and the second inverter INV2 is used to invert a phase of the second detection signal B. In other aspects, the first inverter INV1 and the second inverter INV2 are arranged in the operation circuit $12$ instead of being arranged in the first temporal circuit $2a$ and the second temporal circuit $2b$.

Figure 3:
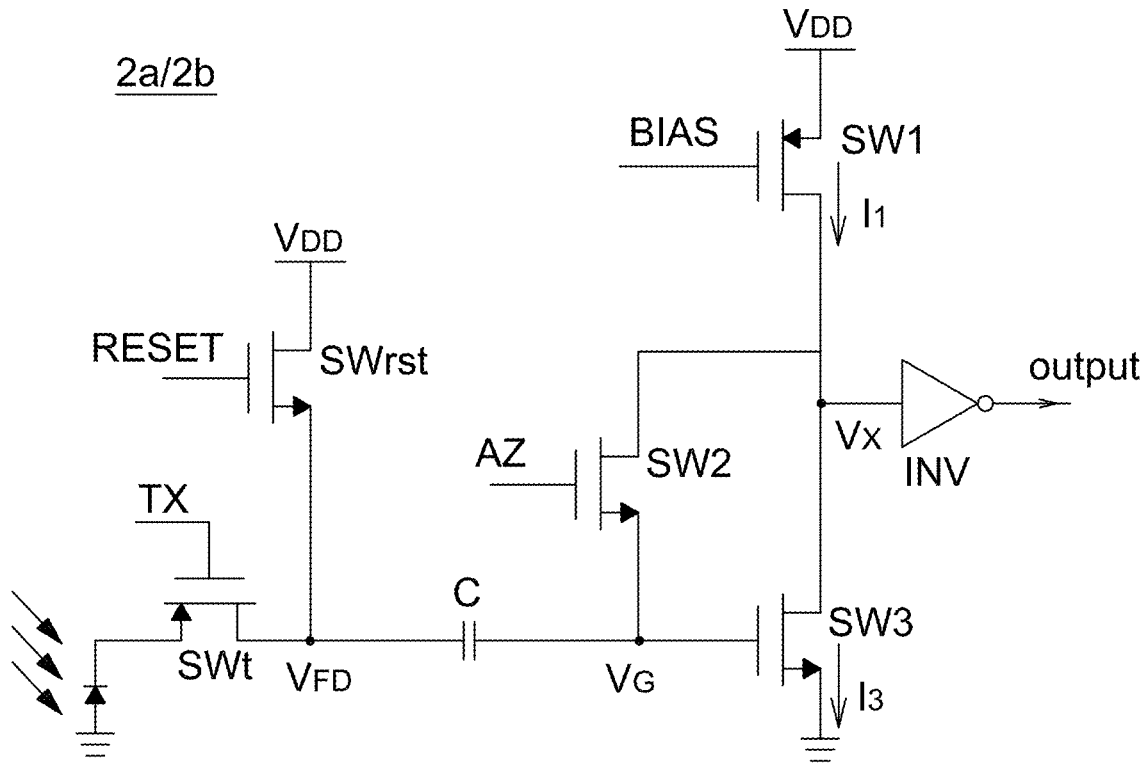
FIG. 3 is a circuit diagram of a temporal circuit of a pixel circuit according to one embodiment of the present disclosure.

Please referring to FIGS. 3 and 4A, FIG. 3 is a circuit diagram of the temporal circuit (e.g., $2a$ and $2b$) of a pixel circuit according to one embodiment of the present disclosure; and FIG. 4A is an operational timing diagram of the temporal circuit $2a/2b$ in FIG. 3. It should be mentioned that although FIG. 2 shows that a single pixel circuit includes two temporal circuits, but the present disclosure is not limited thereto. In other aspects, each pixel circuit includes a single temporal circuit as shown in FIG. 3 to output a PW signal A or B.

In the present disclosure, operation of the temporal circuits $2a$ and $2b$ in FIG. 2 is described using FIGS. 3 and 4A.

The temporal circuits $2a$ and $2b$ respectively include a storage capacitor C, a first transistor SW1, a second transistor SW2 and a third transistor SW3. The storage capacitors and the first to third transistors are indicated by different reference numerals in FIG. 2 to indicate belonging to different temporal circuits.

A first end of the storage capacitor C (shown as a first capacitor C1 in the first temporal circuit $2a$ and as a second capacitor C2 in the second temporal circuit $2b$) is coupled to the reset transistor SWrst. The storage capacitor C is used to store light energy generated by the photodiode PD, e.g., the first light energy $V_{SIG1}$ or the second light energy $V_{SIG2}$.

The first transistor SW1 (shown as SWa1 in the first temporal circuit $2a$ and as SWb1 in the second temporal circuit $2b$) is coupled between the voltage source $V_{DD}$ and a node Vx, and is controlled by a control signal BIAS (shown as BIAS1 in the first temporal circuit $2a$ and as BIAS2 in the second temporal circuit $2b$) to convert the stored light energy to a detection signal, e.g., the first detection signal A or the second detection signal B.

The second transistor SW2 (shown as SWa2 in the first temporal circuit $2a$ and as SWb2 in the second temporal circuit $2b$) is coupled between the storage capacitor C and the first transistor SW1, and controlled by a control signal AZ (shown as AZ1 in the first temporal circuit $2a$ and as AZ2 in the second temporal circuit $2b$). In the first interval $T_{SA}$, the second transistor SWb2 is not conducted to avoid changing the stored energy in the second capacitor C2; and in the second interval $T_{SB}$, the first transistor SWa2 is not conducted to avoid changing the stored energy in the first capacitor C1.

The third transistor SW3 (shown as SWa3 in the first temporal circuit $2a$ and as SWb3 in the second temporal circuit $2b$) is coupled between a second end of the storage capacitor C and a ground voltage.

Please referring to FIG. 4A again, it shows that operation of the temporal circuit $2a/2b$ includes a reset interval, a charge transfer interval, a charge storage interval and a pulse width (PW) convert interval. In the reset interval, control signals BIAS, RESET and AZ are respectively at a high voltage level to reset charges on the storage capacitor C, e.g., a voltage of the node $V_{FD}$ being reset to $V_{RESET}$ (e.g., equal to $V_{DD}$) and a voltage of the node $V_G$ being reset to $V_{AZ}$. In the charge transfer interval, the control signal RESET is changed to a low voltage level, and when the control signal TX is changed to a high voltage level, the light energy $V_{SIG}$ detected by the photodiode PD is transferred to the node $V_{FD}$ via the transfer transistor SWt to cause the voltage thereon to decrease to $V_{RESET}-V_{SIG}$, wherein $V_{SIG}$ indicates the detected light energy. In the charge storage interval, the control signal RESET is changed to the high voltage level again and the control signals BIAS and AZ are changed to low voltage levels to store the light energy $V_{SIG}$ to the node $V_G$ to cause the voltage thereon to increase to $V_{AZ}+V_{SIG}$. Meanwhile, if the control signal AZ is kept at the low voltage level to turn off the second transistor SW2, charges stored in the storage capacitor C are substantially kept constant.

In FIG. 4A, the reset interval, the charge transfer interval and the charge storage interval as a whole is used as an energy storage interval $T_{SA}$ of the first temporal circuit $2a$ or an energy storage interval $T_{SB}$ of the second temporal circuit $2b$. Before the operation circuit $12$ starts to operate, the first temporal circuit $2a$ and the second temporal circuit $2b$ sequentially store light energy detected by the photodiode PD. As shown in FIG. 4A, till the PW convert interval is entered after the operation starts, the first light energy $V_{SIG1}$ in the first temporal circuit $2a$ is converted to the first detection signal A and the second light energy $V_{SIG2}$ in the second temporal circuit $2b$ is converted to the second detection signal B.

In the PW convert interval, the control signal BIAS uses a ramp signal having the voltage level decreasing with time. When the control signal BIAS starts at a high voltage level (e.g., VBIAS AZ), the current I1 flowing through the first transistor SW1 is smaller than the current I3 flowing through the third transistor SW3 to cause an output voltage of Vx to have a low voltage level. With the level decreasing of the control signal BIAS, the current I1 is increasing correspondingly, and when the current I1 is substantially identical to the current I3, the output voltage of Vx changes to a high voltage level to form a negative PW signal. After the output voltage of Vx passes an inverter INV, a positive PW signal is generated as shown in FIG. 4A, wherein a pulse width ΔT is positively related to the light energy $V_{SIG}$. In this way, the temporal circuits $2a$ and $2b$ of the present disclosure convert light energy detected by the photodiode PD to a timing signal to be operated by the operation circuit 12.

Please referring to FIG. 4B, it is an operational timing diagram of the pixel circuit 200 in FIG. 2. The first temporal circuit $2a$ stores first light energy $V_{SIG1}$ in the first capacitor C1 in the first interval (e.g., the energy storage interval $T_{SA}$) using the operation of FIG. 4A. The second temporal circuit $2b$ stores second light energy $V_{SIG2}$ in the second capacitor C2 in the second interval (e.g., the energy storage interval $T_{SB}$) using the operation of FIG. 4A. Next, in the first operation interval $T_{O1}$, the first temporal circuit $2a$ uses a ramp signal having the voltage level decreasing with time as the control signal BIAS1 to convert the first light energy $V_{SIG1}$ into a first detection signal A; meanwhile, the second temporal circuit $2b$ uses a ramp signal having the voltage level decreasing with time as the control signal BIAS2 to convert the second light energy $V_{SIG2}$ into a second detection signal B. Preferably, the ramp signals BIAS1 and BIAS2 are substantially in-phase to generate detection signals A and B substantially at the same time, but not limited thereto. It is possible that detection signals A and B are generated sequentially depending on the operation of the operation circuit 12. The operation circuit 12 performs the numerical calculation on the first detection signal A and the second detection signal B in the first operation interval $T_{O1}$, e.g., the summation, subtraction and absolute differencing given in the present disclosure, but the present disclosure is not limited to these operations.

As shown in FIG. 4B, in the first operation interval $T_{O1}$, the first interval $T_{SA}$ for storing the first light energy $V_{SIG1}$ is prior to the second interval $T_{SB}$ for storing the second light energy $V_{SIG2}$.

In one aspect, after the first operation interval $T_{O1}$ is over, the second temporal circuit $2b$ continuously holds the second light energy $V_{SIG2}$, but the first temporal circuit $2a$ stores a next first light energy $V_{SIG1}'$ in the first capacitor C1 in a next energy storage interval $T_{SA}'$ also using the operation of FIG. 4A. Next, in a second operation interval $T_{O2}$, the first temporal circuit $2a$ uses a ramp signal having the voltage level decreasing with time as the control signal BIAS1 to convert the first light energy $V_{SIG1}'$ into a first detection signal A'; meanwhile, the second temporal circuit $2b$ uses a ramp signal having the voltage level decreasing with time as the control signal BIAS2 to convert the second light energy $V_{SIG2}$ into a second detection signal B, which is substantially identical to that generated in the first operation interval $T_{O1}$. The operation circuit 12 performs the numerical calculation on the first detection signal A' and the second detection signal B in the second operation interval $T_{O2}$. In the second operation interval $T_{O2}$, the first interval $T_{SA}'$ for storing the first light energy $V_{SIG1}'$ is behind the second interval $T_{SB}$ for storing the second light energy $V_{SIG2}$.

In the next energy storage interval, the first light energy $V_{SIG1}'$ in the first temporal circuit $2a$ is maintained, but the second light energy in the second temporal circuit $2b$ is updated to $V_{SIG2}'$. By alternatively updating the light energy stored in the first temporal circuit $2a$ and the second temporal circuit $2b$ as shown in FIG. 4B, it is possible to perform the numerical calculation on signals of different time intervals.

Please referring to FIG. 5, it is a circuit diagram of a subtraction circuit 500 according to one embodiment of the present disclosure, which has two inputs respectively coupled to the first temporal circuit $2a$ and the second temporal circuit $2b$ to respectively receive a first detection signal A having a first pulse width T1 and a second detection signal B having a second pulse width T2. The subtraction circuit 500 includes an operation capacitor Co and cascaded first operation transistor SWA and second operation transistor SWB, wherein the operation capacitor Co is connected between the first operation transistor SWA and the second operation transistor SWB. The first operation transistor SWA is used as a switch to control a charging interval of a first current Ic to charge the operation capacitor Co according to the first pulse width T1; and the second operation transistor SWB is used as a switch to control a discharging interval of a second current Id to discharge the operation capacitor Co according to the second pulse width T2, wherein the first current Ic is substantially identical to the second current Id. In this way, the subtraction circuit 500 performs the numerical calculation of A-B. It is appreciated that when the subtraction circuit 500 performs the numerical calculation of B-A, gates of the first operation transistor SWA and the second operation transistor SWB receive opposite input signals, e.g., implemented by using a switching device or a multiplexer.

Please referring to FIG. 6, it is a circuit diagram of an addition circuit 600 according to one embodiment of the present disclosure, which has two inputs respectively coupled to the first temporal circuit $2a$ and the second temporal circuit $2b$ to respectively receive a first detection signal A having a first pulse width T1 and a second detection signal B having a second pulse width T2. The addition circuit 600 includes an operation capacitor Co and a first operation transistor SWA and a second operation transistor SWB connected in parallel, wherein the operation capacitor Co is connected between the first operation transistor SWA and the second operation transistor SWB. The first operation transistor SWA is used as a switch to control a first charging interval of a first current Ic1 to charge the operation capacitor Co according to the first pulse width T1; and the second operation transistor SWB is used as a switch to control a second charging interval of a second current Ic2 to charge the operation capacitor Co according to the second pulse width T2, wherein the first current Ic1 is substantially identical to the second current Ic2. In this way, the addition circuit 600 performs the numerical calculation of A+B.

Referring to FIG. 7, it is a circuit diagram of an absolute difference circuit 700 according to one embodiment of the present disclosure, which has two input sets respectively coupled to the first temporal circuit $2a$ and the second temporal circuit $2b$ to respectively receive first detection signals A and Abar having a first pulse width T1 and second detection signals B and Bbar having a second pulse width T2, wherein Abar and Bbar are generated from A and B using the inverter or vice versa. When the first pulse width T1 is larger than the second pulse width T2, the first input set (including operation transistors SWA and SWBbar) receives the pulse width signals A and Bbar to control a first charging interval of a first current Ic1 to charge the operation capacitor Co. When first pulse width T1 is smaller than the second pulse width T2, the second input set (including operation transistors SWB and SWAbar) receives the pulse width signals B and Abar to control a second charging interval of a second current Ic2 to charge the operation capacitor Co. In this way, the absolute difference circuit 700 performs the numerical calculation of |A−B|.

Although the current sources in FIGS. 5-7 are shown to be implemented by controlling a transistor using a control signal PBIAS, but the present disclosure is not limited thereto. Other current sources may be used.

Figure 8:
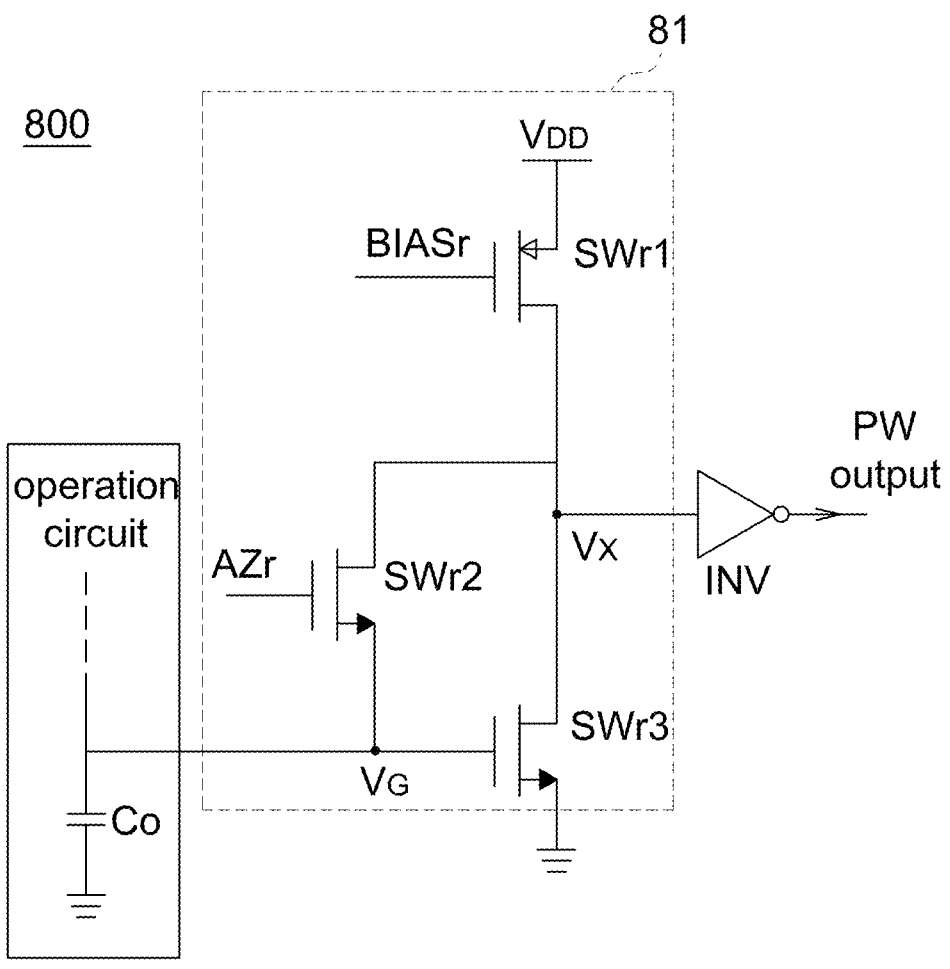
FIG. 8 is a circuit diagram of a recursive circuit of a pixel circuit according to one embodiment of the present disclosure.

Please referring to FIG. 8, it is a circuit diagram of a recursive circuit 800 of a pixel circuit according to one embodiment of the present disclosure. The recursive circuit 800 is coupled to the operation circuit 12 and used to control the operation timing of the operation circuit 12 and convert the operation result (i.e. charges stored in the operation capacitor Co) into a pulse width signal again for the next operation, e.g., the PW output of the recursive circuit 800 being coupled to one signal input of the operation circuit 12 as the signal A or B in FIGS. 5 to 7.

The recursive circuit 800 includes a first recursive transistor SWr1, a second recursive transistor SWr2 and a third recursive transistor SWr3, which have identical connection as the first transistor SW1, the second transistor SW2 and the third transistor SW3 in FIG. 3.

In FIG. 8, the circuit in a dashed block 81 is referred to a voltage-temporal conversion circuit which is used to convert a voltage on the operation capacitor Co to a PW signal similar to A and B, wherein the operation capacitor Co in FIG. 8 is the operation capacitor Co in FIGS. 5 to 7.

Figure 9:
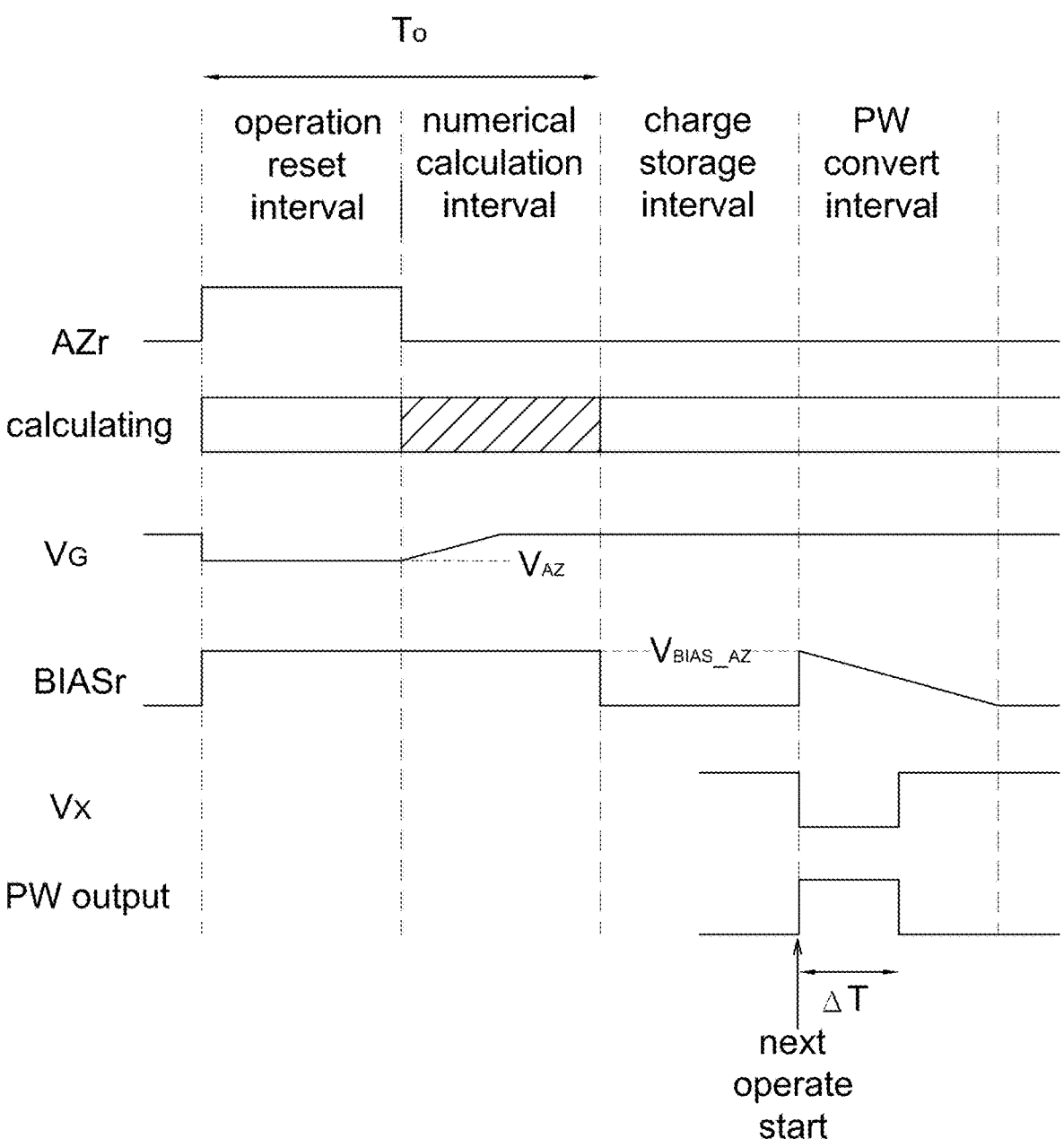
FIG. 9 is an operational timing diagram of the recursive circuit in FIG. 8.

Please referring to FIG. 9 together, it is an operational timing diagram of the recursive circuit 800 in FIG. 8. Before the operation capacitor Co starts to perform the numerical calculation on the detection signal A from the first temporal circuit 2a and the second detection signal B from the second temporal circuit 2b, the operation capacitor Co is reset at first. In the operation reset interval, control signals AZr and BIASr are respectively changed to a high voltage level for resetting a voltage of the operation capacitor Co to $V_{AZ}$. In this aspect, the second recursive transistor SWr2 is used as an operation reset transistor so as to reset the voltage of the operation capacitor Co in the operation reset interval. In the numerical calculation interval (e.g., slant-lines region), the control signal AZr is changed to a low voltage level and the operation result of the operation circuit 12 is stored in the operation capacitor Co to change a voltage thereon, wherein magnitude of the voltage change is corresponding to the operation result. Next, in the charge storage interval, the operation capacitor Co holds the voltage thereon. Till a next operation starts, the voltage-temporal conversion circuit 81 converts the calculated voltage to a PW signal for the operation of the operation circuit 12. The operations of the charge storage interval and the PW convert interval of the recursive circuit 800 are similar to those of the charge storage interval and the PW convert interval in FIG. 4A, e.g., using a ramp signal to generate the PW signal, and thus details thereof are not repeated herein.

In one aspect, the recursive circuit 800 further includes an inverter INV to invert a phase of the outputted PW signal. However, when the operation circuit 12 includes an inverter therein, the recursive circuit 800 does not include the inverter INV.

In the present disclosure, the PW convert interval of FIG. 4A as well as the operation reset interval and the numerical calculation interval of FIG. 9 as a whole is referred to an operation interval TO herein, wherein the operation reset interval of FIG. 9 is performed in parallel with or behind the PW convert interval of FIG. 4A.

It is appreciated that if there is no next operation after the recursive circuit 800, the recursive circuit 800 directly provides (e.g., controlled by a switching device) the calculated voltage on the operation capacitor Co to the identify circuit 14 for identification, e.g., compared with a reference voltage using a comparator.

The circuit in FIG. 8 is called recursive circuit because the operation result of the operation circuit 12 may be stored and then converted to a PW signal multiple times by the recursive circuit 800 to perform multiple recursive operations. That is, the operation circuit 12 not only calculates the detected result of the photodiode PD, but also calculates operation result thereof with the operation result of other pixels.

In this way, by using the pixel circuit 200 of FIG. 2 in conjunction with the recursive circuit 800 of FIG. 8, it is possible to perform various pixel-wise operations on the pixel data for various applications. The identify circuit 14 performs various identifications according to a final operation result of the pixel circuit 20 and the recursive circuit 800, e.g., identifying the lift-up of a navigation device, calculating the navigation vector, performing image recognition, categorizing images, performing motion detection and performing multi-layer neural network so as to realize the pixel structure with pixel-wise operation.

Figure 10:
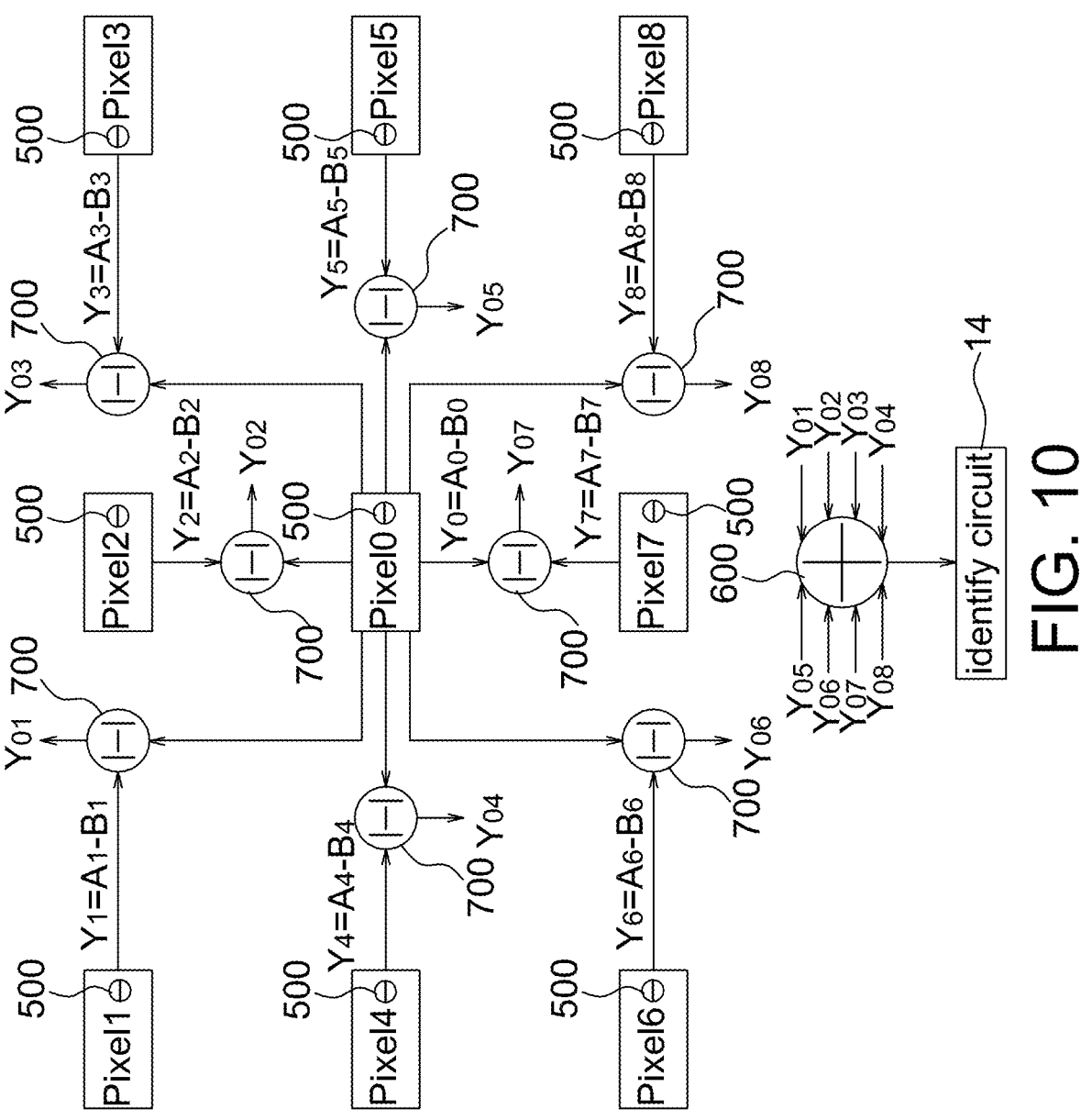
FIG. 10 is a schematic diagram of one application of a pixel circuit according to one embodiment of the present disclosure.

For example referring to FIG. 10, it is a schematic diagram of one application of the pixel circuit of the present disclosure that performs the motion detection (e.g., adapted to a security system). A pixel array of a camera includes multiple pixels arranged in an array. The identify circuit 14 performs the motion detection according to 9 adjacent pixels, including pixel 0 to pixel 8, wherein the pixel 0 is a central pixel of pixel 1 to pixel 8. In this aspect, the pixels 0 to 8 respectively include the pixel circuit 200 in FIG. 2 and/or at least one operation circuit 12.

As mentioned above, pixels 0 to 8 respectively generate a first detection signals A0 to A8 and second detection signals B0 to B8. After the subtraction circuit 500 (e.g., included in the pixel circuit of pixels 0 to 8, but not limited to) performs the numerical calculation on the first detection signals A0 to A8 and the second detection signal B0 to B8 of the pixels 0 to 8, the subtracted result Y0 to Y8 are obtained and stored in the corresponding operation capacitor Co (e.g., shown in FIG. 8), wherein Y0 to Y8 indicate that each of pixels 0 to 8 performs the temporal difference operation on detected signals obtained in different detection intervals to represent the brightness variation detected by every pixel.

Next, after converting Y0 to Y8 to PW signals using the recursive circuit 800, the absolute difference circuit 700 performs the numerical calculation of absolute differencing between Y0 and Y1, Y0 and Y2 . . . Y0 and Y8 to obtain Y01 to Y08, wherein Y01 to Y08 indicate that the pixel array performs the spatial difference operation between different pixels, and Y01 to Y08 contain the operation result of both the temporal difference and spatial difference.

Finally, Y01 to Y08 are summed by the addition circuit 600. Similarly, Y01 to Y08 are firstly stored in the corresponding operation capacitor Co, and then converted to PW signals by the voltage-temporal conversion circuit 81 for the summation of the addition circuit 600.

In one aspect, the addition circuit 600 includes two inputs as shown in FIG. 6, and the addition circuit each time performs the summation of two of Y01 to Y08 that is stored and voltage-temporal converted, and then summed with another one of the rest of Y01 to Y08 till all of Y01 to Y08 is added together.

In another aspect, the addition circuit includes 8 inputs and uses the pulse widths associated with Y01 to Y08 to control the charging intervals of respective current sources as a way of adding Y01 to Y08 together.

The identify circuit 14 receives a summation of the addition circuit 600, and compares the summation with a predetermined threshold (e.g., using a comparator). When the summation of Y01 to Y08 is larger than or equal to the predetermined threshold, it means that a motion is detected. The identify circuit 14 then outputs a control signal to perform corresponding controls, e.g., turning on a light source, starting to record images or increasing image capture frequency.

In another aspect, the identify circuit 14 receives a summation of the temporal differences Y0 to Y8 (e.g., Y0 to Y8 directly outputted to the addition circuit 600 from pixels 0 to 8). When the summation is larger than or smaller than (determined according to the light source arrangement) a brightness threshold, it means that a mouse device is lifted up by a user.

It is appreciated that although FIG. 10 uses 9 neighboring pixels to detect the temporal and spatial brightness variation to perform the motion detection or lift-up detection, the present disclosure is not limited thereto. The identify circuit 14 uses a proper number of pixels to detect the temporal and spatial brightness variation, e.g., the proper number being determined according to environment to be detected and a size of pixel array.

Figure 11A:
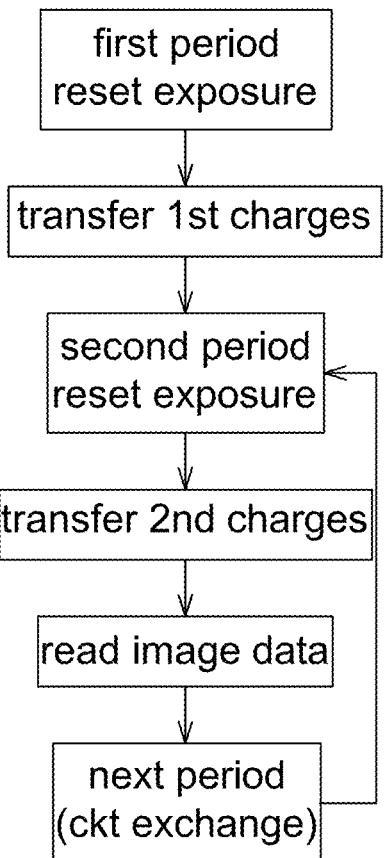
FIGS. 11A to 11C are flow charts of different modes performed by a pixel circuit according to some embodiments of the present disclosure.
Figure 11B:
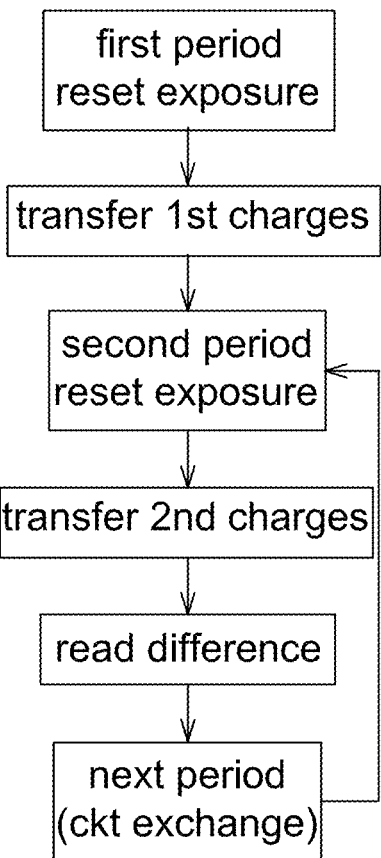
Figure 11C:
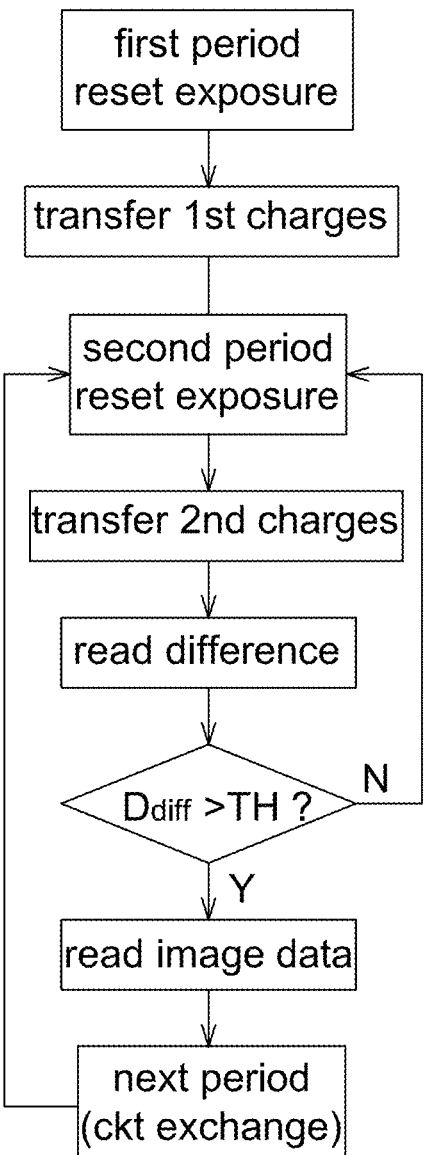

The pixel circuit 200 of the present disclosure in FIG. 2 operates in different modes, e.g., including outputting image data as shown in FIG. 11A, outputting difference data as shown in FIG. 11B and checking whether to output image data as shown in FIG. 11C, according to different control signals, wherein the mode III is considered as a combination of modes I and II.

Figure 12:
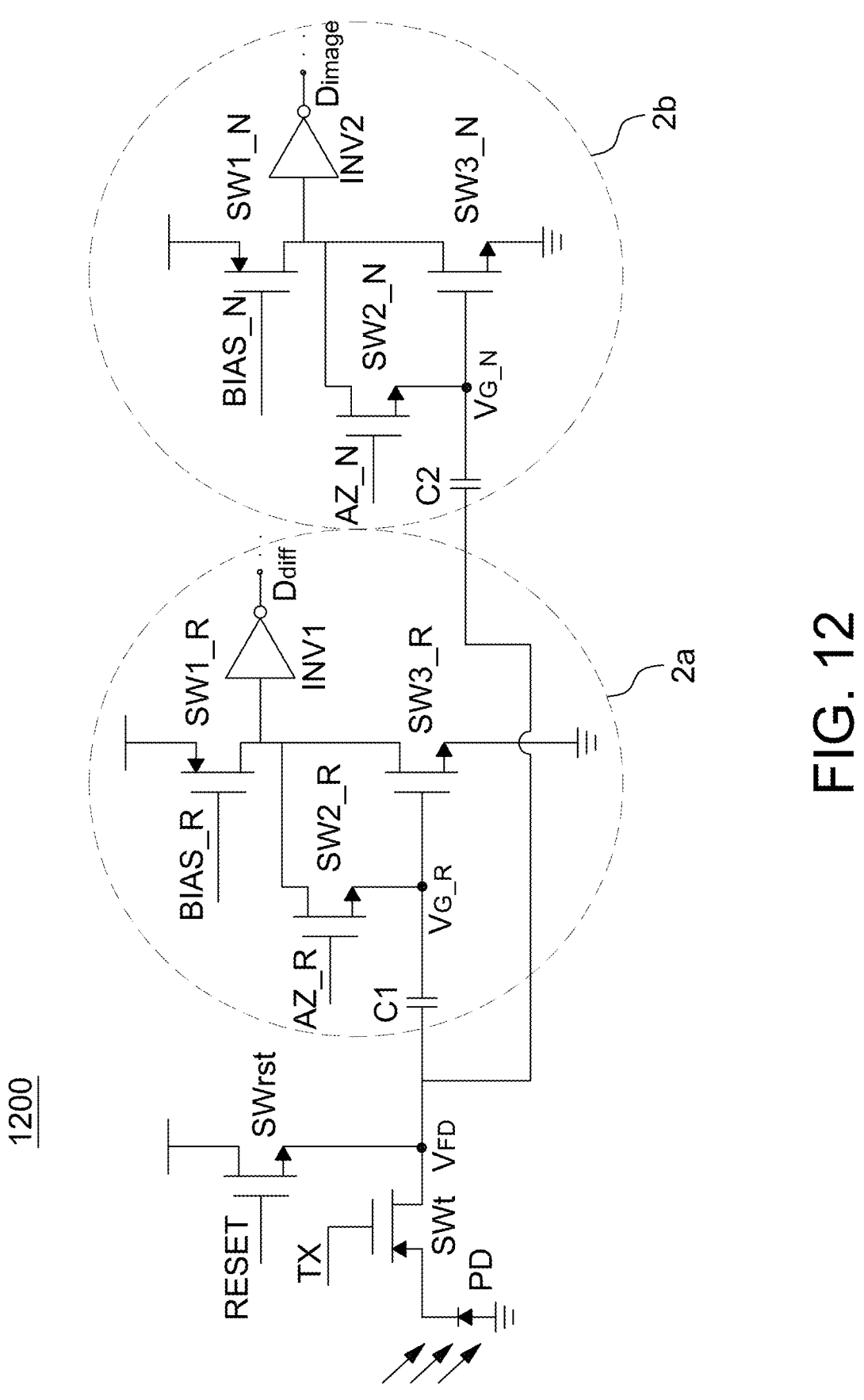
FIG. 12 is a schematic diagram of outputting time difference data or image date by a pixel circuit according to one embodiment of the present disclosure.

In FIG. 12, the first temporal circuit 2a is shown to output difference data $D_{diff}$ in an output interval (e.g., $T_{O1}$ in FIG. 4B) and the second temporal circuit 2b is shown to output image data $D_{image}$ in the output interval. In a next output interval (e.g., $T_{O2}$ in FIG. 4B), the first temporal circuit 2a outputs the image data $D_{image}$ but the second temporal circuit 2b outputs the difference data $D_{diff}$, repeatedly exchanging in successive output intervals.

That is, the "ckt exchange" shown in FIGS. 11A to 11C means temporal circuits recording and outputting the difference data $D_{diff}$ and the image data $D_{image}$ exchange in every output interval, i.e. an interval reading data or signal from the temporal circuits.

The pixel circuit 1200 of FIG. 12 is identical to that in FIG. 2, and the difference therebetween is that control signals are changed to obtain different output signals from the two temporal circuits. In addition, to indicate different temporal circuits, elements and signals in the first temporal circuit 2a are indicated by _R, and elements and signals in the second temporal circuit 2b are indicated by _N in FIG. 12.

Figure 13:
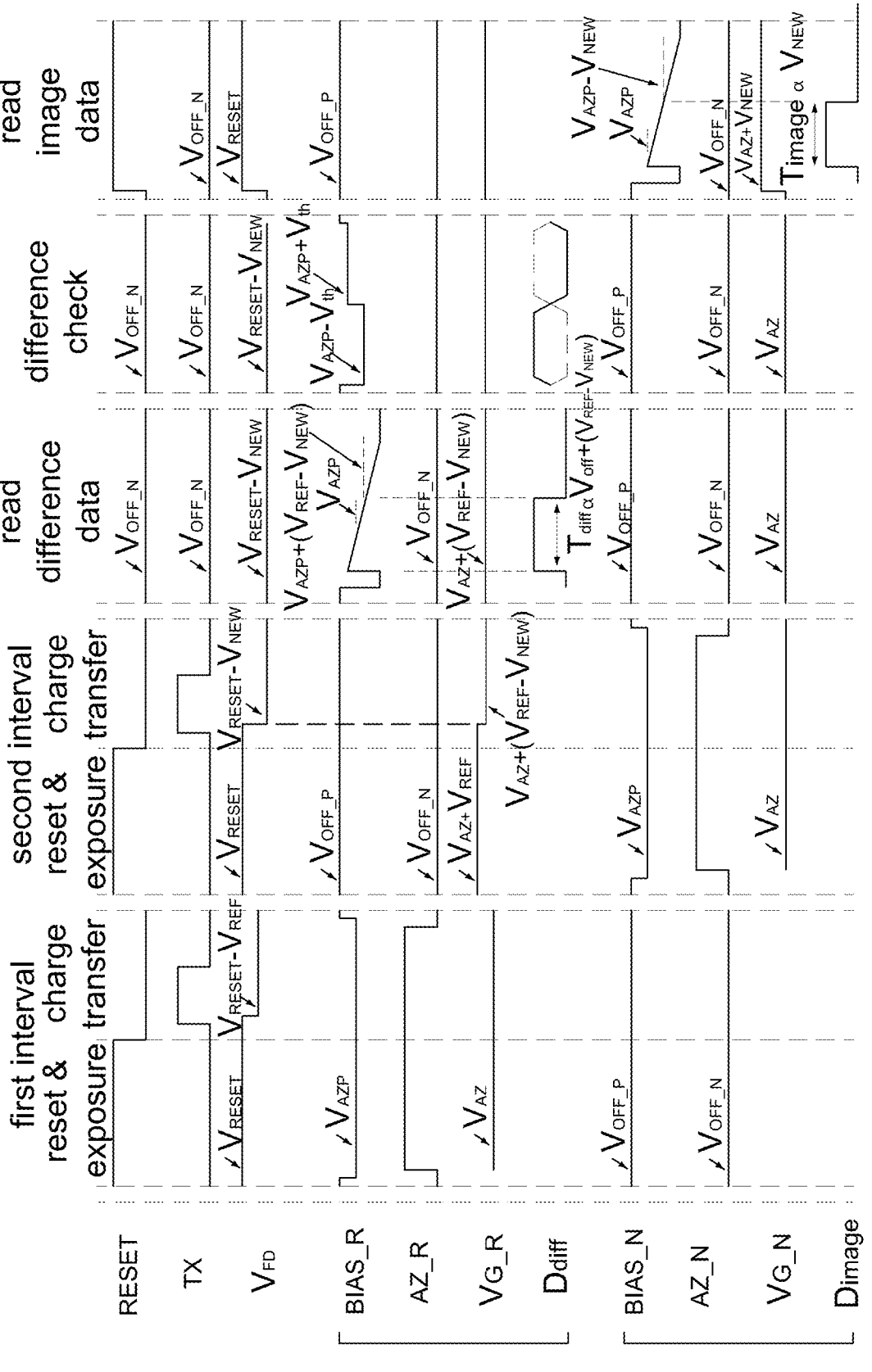
FIG. 13 is a signal timing diagram of the pixel circuit of FIG. 12.

Please refer to FIG. 13, it is a signal timing diagram of the pixel circuit 1200 in FIG. 12, including a first interval and a second interval for recording light energy, and three output intervals including a read difference data interval, a difference check interval and a read image data interval.

In the reset & exposure interval of the first interval, the photodiode PD is exposed, and a voltage on the node $V_{FD}$ is reset to $V_{RESET}$ and a voltage on the node $V_{G\_R}$ is reset to $V_{AZ}$ based on the arrangement of control signals BIAS_R·RESET and AZ_R as shown in FIG. 13.

In the charge transfer interval of the first interval, light energy $V_{REF}$ is transferred to the node $V_{FD}$ via the transfer transistor SWt such that a voltage on the node $V_{FD}$ is changed to $V_{RESET}$-$V_{REF}$ based on the arrangement of control signals BIAS_R·RESET and AZ_R as shown in FIG. 13.

In the reset & exposure interval of the second interval, the photodiode PD is exposed again, and a voltage on the node $V_{FD}$ is reset to $V_{RESET}$ again. Now, as the storage capacitor C1 is floated (i.e., AZ_R changed to low voltage level), corresponding to a voltage change $V_{REF}$ on the node $V_{FD}$, a voltage on the node $V_{G\_R}$ is increased by $V_{REF}$ to become $V_{AZ}$+$V_{REF}$.

In the charge transfer interval of the second interval, light energy $V_{NEW}$ is transferred to the node $V_{FD}$ via the transfer transistor SWt such that a voltage on the node $V_{FD}$ is changed to $V_{RESET}$-$V_{NEW}$, wherein the meaning of $V_{REF}$ is similar to $V_{SIG1}$ in FIG. 4B, and the meaning of $V_{NEW}$ is similar to $V_{SIG2}$ in FIG. 4B, only both $V_{REF}$ and $V_{NEW}$ in this embodiment are transferred to the node $V_{FD}$. Now, because the storage capacitor C1 is still floated, a voltage on the node $V_{G\_R}$ is changed to $V_{AZ}$+($V_{REF}$-$V_{NEW}$). That is, the node $V_{G\_R}$ records a light energy variation ($V_{REF}$-$V_{NEW}$) between the first interval and the second interval detected by the photodiode PD.

Next, by selecting control signals BIAS_R or BIAS_N, different modes shown in FIGS. 11A to 11C are selected.

In mode I shown in FIG. 11A, detected light energy $V_{NEW}$ of the second temporal circuit 2b is read. Since the detected light energy $V_{NEW}$ is not differenced with light energy detected in another interval, the detected light energy $V_{NEW}$ is considered as image data detected by the pixel circuit 1200 in the second interval.

Please refer to FIG. 13 again, in the charge transfer interval of the second interval, a voltage on the node $V_{FD}$ becomes $V_{RESET}$-$V_{NEW}$. In the read image data period, the storage capacitor C2 is floated (i.e., AZ_N changed to low voltage level). When a voltage on the node $V_{FD}$ is reset to $V_{RESET}$, corresponding to a voltage change $V_{REF}$ on the node $V_{FD}$, a voltage on the node $V_{G\_N}$ is increased by $V_{NEW}$ to become $V_{AZ}$+$V_{NEW}$. Using the similar method as FIG. 4A, a ramp signal is used as a control signal BIAS_N to be inputted to the first transistor SW1_N to output a pulse width signal Timage, whose length is corresponding to magnitude of the light energy $V_{NEW}$, and details thereof have been illustrated above and are not repeated again. The pulse width signal Timage is analog operated by other operation circuits as mentioned above or used in other applications by a backend processor, e.g., image recognition or motion detection, but not limited to.

In a next interval, when the photodiode PD is exposed, new image data is recorded in the first temporal circuit 2a, but new difference data is recorded in the second temporal circuit 2b. Using the similar method as FIG. 4A, a ramp signal is used as a control signal BIAS_R to be inputted to the first transistor SW1_R to output a timing signal (i.e. pulse width signal) Timage as image data outputted by the pixel circuit 1200.

In mode II shown in FIG. 11B, a light energy variation ($V_{REF}$-$V_{NEW}$) of the first temporal circuit 2a is read. Please refer to FIG. 13 again, in the charge transfer interval of the second interval, a voltage on the node $V_{G\_R}$ is changed to $V_{AZ}+(V_{REF}-V_{NEW})$. In the read difference data interval, using the similar method as FIG. 4A, a ramp signal is used as a control signal BIAS_R to be inputted to the first transistor SW1_R to output a timing signal Tdiff, whose length is corresponding to magnitude of the light energy variation $(V_{REF}-V_{NEW})$, and details thereof have been illustrated above and thus are not repeated again.

It should be mentioned that in the read difference data interval, depending on light energy detected by the photodiode PD in different intervals, the light energy variation $(V_{REF}-V_{NEW})$ is a positive or a negative value. In order to be able to output a corresponding pulse width signal (pulse width having no negative value) when $(V_{REF}-V_{NEW})$ is a negative value, a start voltage of the ramp signal is not from $V_{AZP}$ but from a voltage added by an offset voltage Voff. Although FIG. 13 shows that the pulse width signal Tdiff is positively related to Voff+$(V_{REF}-V_{NEW})$, when Voff is a fixed value, the pulse width signal Tdiff is substantially related to $(V_{REF}-V_{NEW})$ only.

It should be mentioned that although FIG. 13 shows that ramp control signals BIAS_R and BIAS_N are started after a voltage deep, the voltage deep is to form a start point of the ramp signal.

In a next interval, when the photodiode PD is exposed, new difference data $D_{diff}$ is recorded in the second temporal circuit 2b, but new image data $D_{image}$ is recorded in the first temporal circuit 2a. Using the similar method as FIG. 4A, a ramp signal is used as a control signal BIAS_N to be inputted to the first transistor SW1_N to output a timing signal Tdiff as difference data outputted by the pixel circuit 1200.

In mode III shown in FIG. 11C, it is able to identify whether to read image data recorded in the second temporal circuit 2b according to a difference signal $(V_{REF}-V_{NEW})$ recorded in the first temporal circuit 2a.

Please refer to FIG. 13 again, in the difference check interval, a voltage $V_{AZP}$ of the control signal BIAS_R is added and subtracted by a voltage threshold Vth to be compared with $V_{AZ}+(V_{REF}-V_{NEW})$. When the variation $(V_{REF}-V_{NEW})$ is larger than Vth, the difference signal $D_{diff}$ has a state change, e.g., from 1 to 0 or from 0 to 1, indicating that the pixel circuit 1200 detects a light energy variation between the first interval and the second interval. Accordingly, the backend processor reads image data recorded on the node $V_{G\_N}$ of the second temporal circuit 2b of the pixel circuit 1200 in the read image data interval.

If the variation $(V_{REF}-V_{NEW})$ is not larger than Vth, a voltage on the node $V_{G\_N}$ is not read, and light energy detection of a next interval is performed as shown in FIG. 11C.

Similarly, in said next interval, when the photodiode PD is exposed, storage locations of the difference data and the image data are exchanged. The backend processor identifies whether a light energy variation is larger than or equal to a threshold Vth according to difference signal $D_{diff}$ of the second temporal circuit 2b to determine whether to read image data $D_{image}$ from the first temporal circuit 2a.

It should be mentioned that the read difference data interval, the difference check interval and the read image data interval in FIG. 13 are not necessary to be all executed, but at least one is executed according to different applications.

For example please refer to FIG. 14, when a pixel array includes multiple pixel circuits 1200 (or 1500, 1700, 1800, 1900 mentioned below), based on the difference check shown in FIG. 13, it is able to check whether every pixel circuit 1200 detects a light energy variation between a first image frame and a second image frame, i.e., by identifying a state change in the signal $D_{diff}$.

Figure 14:
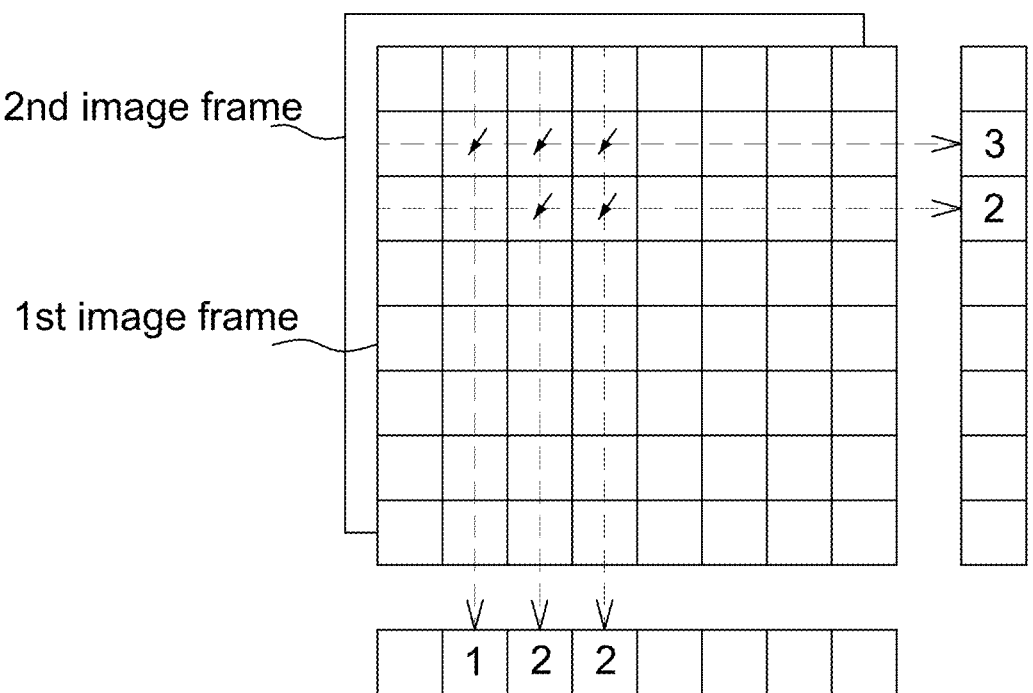
FIG. 14 is a schematic diagram of performing the time difference detection by a pixel array adopting the pixel circuit of the present disclosure.

In one aspect, a backend processor (e.g., the identifying circuit mentioned above or a backend host) tags pixel circuit(s) 1200 detecting enough light energy variation, e.g., FIG. 14 showing five pixel circuits (respectively indicated by an arrow symbol) detecting the light energy variation, i.e. $D_{diff}$ having a state change.

In another aspect, the backend processor reads image data (i.e., pulse width signal herein) of the pixel circuit(s) 1200 that detects the light energy variation for updating image data stored in a corresponding frame buffer in the backend. The image data in the frame buffer is for the image recognition or motion detection, but not limited to. The backend processor does not read pixel circuit(s) 1200 without detecting the light energy variation.

It should be mentioned that how the backend processor uses the pixel circuit(s) 1200 detecting enough light energy variation and image data thereof is determined according to different applications.

As mentioned above, because the pixel circuit 1200 of the present disclosure includes two temporal circuits, after the reset & exposure and the charge transfer of two different intervals have been accomplished, the two temporal circuits respectively record time difference data (or signal) and image data. By selecting different control signals BIAS_R and BIAS_N (e.g., using a switching device or multiplexer), different modes of FIG. 11A to FIG. 11C are operated.

Figure 15:
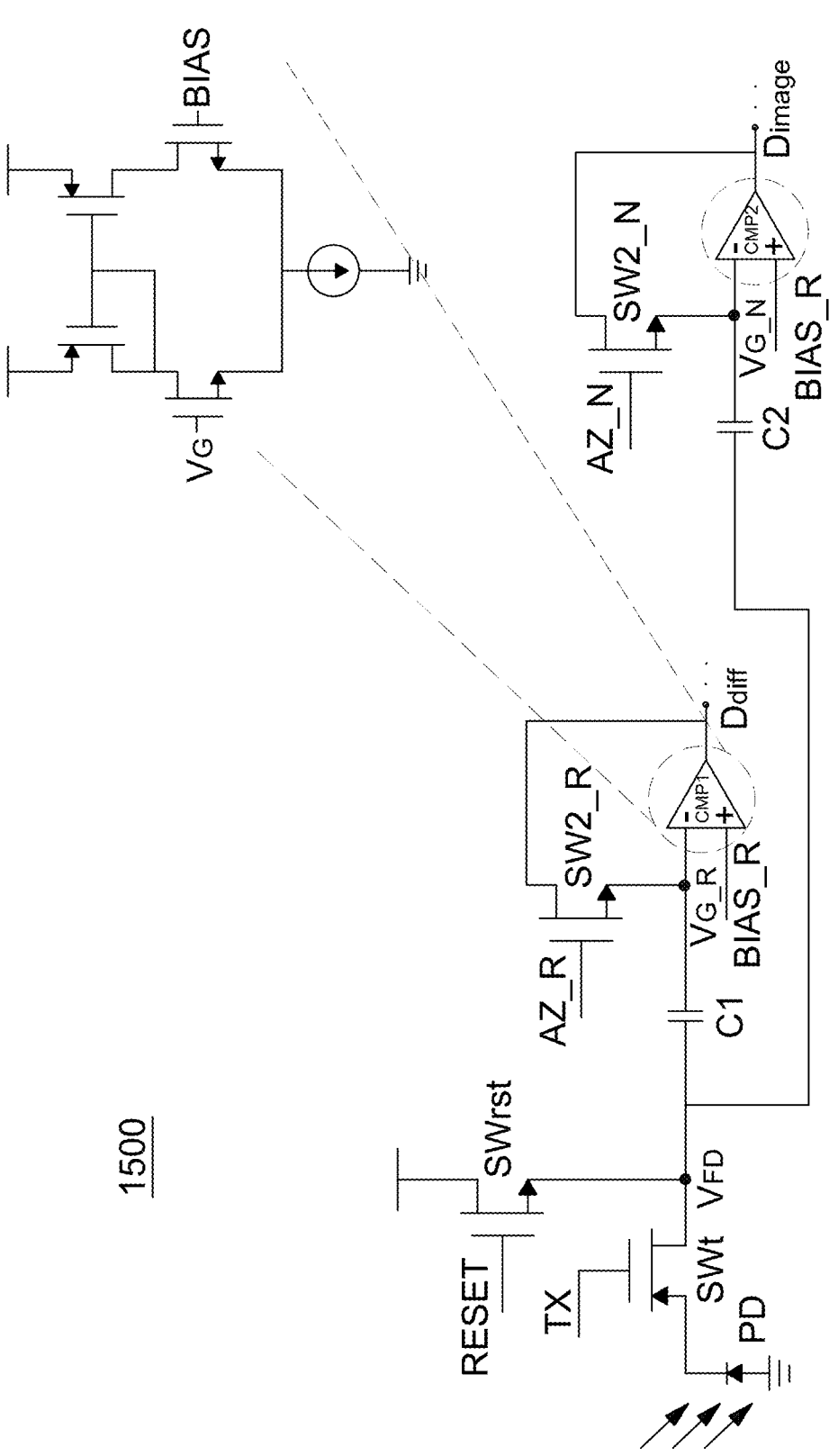
FIG. 15 is a circuit diagram of an alternative embodiment I of the present disclosure.

Please refer to FIG. 15, it is a circuit diagram of a pixel circuit 1500 according to an alternative embodiment of the present disclosure. The pixel circuit 1500 is also capable of operating in different modes of FIGS. 11A to 11C according to different control signals BIAS_R and BIAS_N.

The difference between the pixel circuit 1500 in FIG. 15 and the pixel circuit 1200 in FIG. 12 is that comparators are used to replace the first transistors SW1_R and SW1_N as well as the third transistors SW3_R and SW3_N. The circuit shown in the top right corner of FIG. 15 indicates a structure of both comparators and input signals thereof. An inverting input terminal of the comparator CMP1 is connected to a second end of the first capacitor C1 and the second transistor SW2_R. A non-inverting input terminal of the comparator CMP1 receives the control signal BIAS_R. An inverting input terminal of the comparator CMP2 is connected to a second end of the second capacitor C2 and the second transistor SW2_N. A non-inverting input terminal of the comparator CMP2 receives the control signal BIAS_N. Compared with FIG. 12, this embodiment can reduce the current and the influence of noises.

Figure 16:
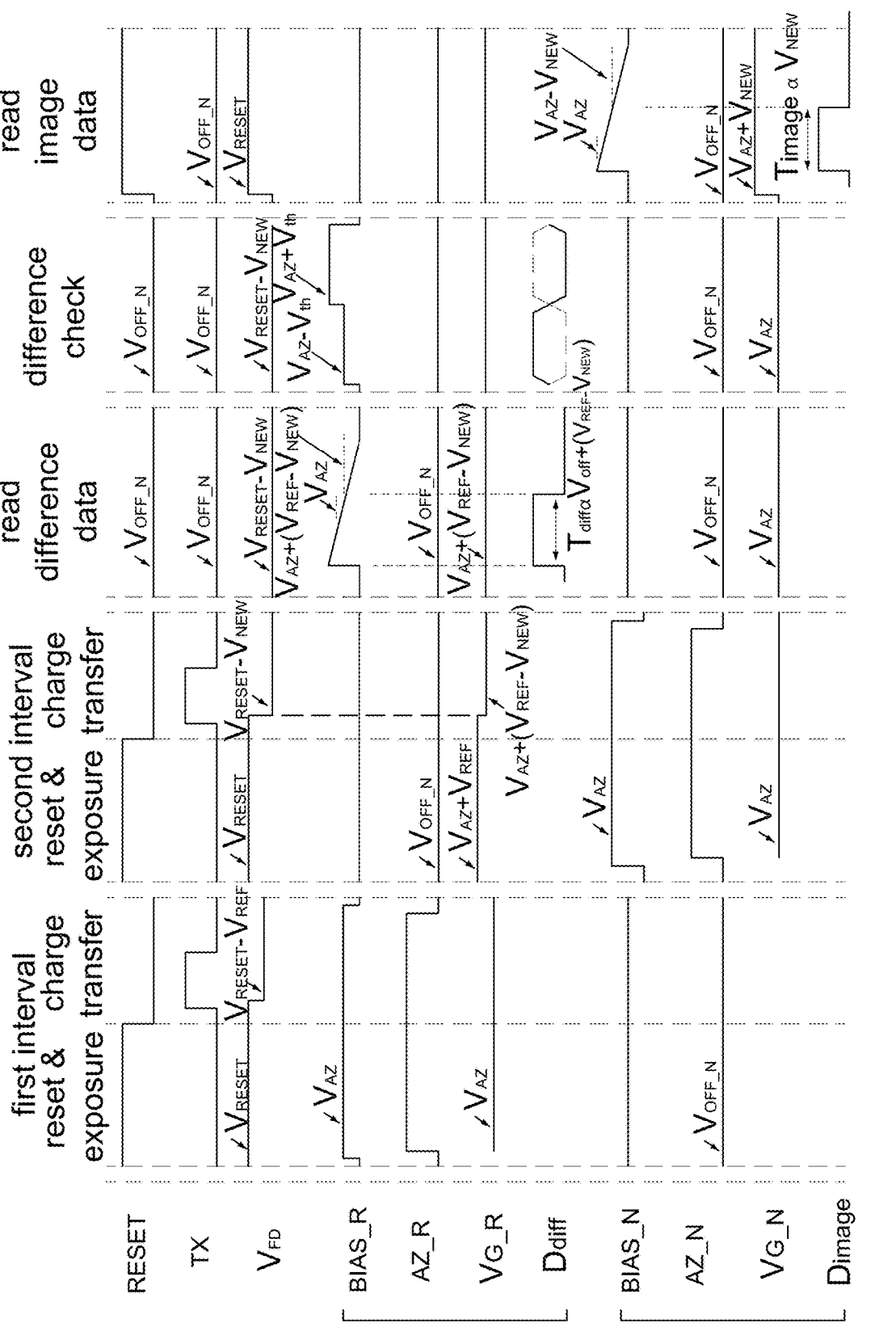
FIG. 16 is a signal timing diagram of the pixel circuit of FIG. 15.

Please refer to FIG. 16, it is a signal timing diagram of the pixel circuit 1500 of FIG. 15.

Similarly, in a first interval, the photodiode PD is exposed, and a voltage on the node $V_{FD}$ becomes $V_{RESET}-V_{REF}$ based on the arrangement of control signals BIAS_R、RESET and AZ_R as shown in FIG. 16. In a second interval, the photodiode PD is exposed again, and a voltage on the node $V_{G\_R}$ becomes $V_{AZ}+(V_{REF}-V_{NEW})$ based on the arrangement of control signals BIAS_R、RESET and AZ_R as shown in FIG. 16.

In a read image data interval, the storage capacitor C2 is floated (i.e. AZ_N changed to a low voltage level). When a voltage on the node $V_{FD}$ is reset to $V_{RESET}$, corresponding to a voltage variation $V_{REF}$ on the node $V_{FD}$, a voltage on the node $V_{G\_N}$ is increased by $V_{NEW}$ to become $V_{AZ}+V_{NEW}$. A ramp signal is used as a control signal BIAS_N to be inputted to the comparator CMP2 to cause the comparator CMP2 to output a timing signal Timage.

In a read difference data interval, a ramp signal is used as a control signal BIAS_R to be inputted to the comparator CMP1 to cause the comparator CMP1 to output a timing signal Tdiff.

In a difference check interval, the voltage $V_{AZ}$ is added and subtracted by a voltage threshold Vth as the control signal BIAS_R to be compared with $V_{AZ}+(V_{REF}-V_{NEW})$. When the variation $(V_{REF}-V_{NEW})$ is larger than Vth, the difference signal $D_{diff}$ has a state change.

The read difference data, difference check and read image data are similar to those shown in FIG. 13, and the main difference is that the control signals BIAS_R and BIAS_N are different.

In FIG. 15, all transistors of the comparators CMP1 and CMP2 are arranged in the pixel circuit 1500, and thus the pixel circuit 1500 has a larger area.

Figure 17:
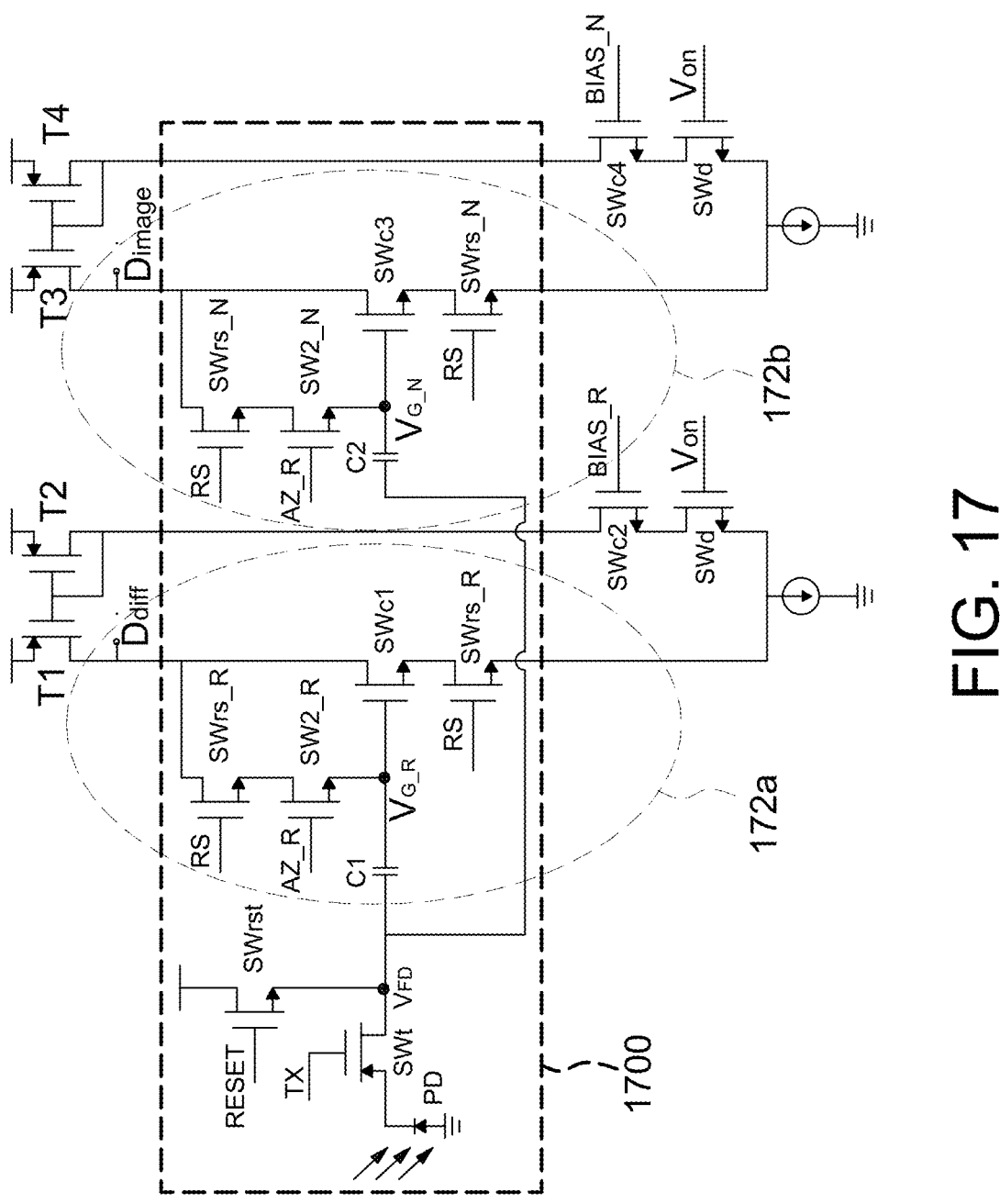
FIG. 17 is a circuit diagram of an alternative embodiment II of the present disclosure.

Please refer to FIG. 17, it is a circuit diagram of a pixel circuit 1700 according to an alternative embodiment of the present disclosure. The main difference from FIG. 15 is that a first input transistor SWc1 and a third input transistor SWc3 of comparators are arranged inside the pixel circuit 1700, but other transistors of the comparators are arranged outside the pixel circuit 1700 to be shared with other pixel circuits. Said other pixel circuits are multiple pixel circuits at the same column (e.g., same column of a pixel array shown in FIG. 14) as the pixel circuit 1700.

The signal timing diagram of the pixel circuit 1700 is also in FIG. 16.

In this alternative embodiment, the pixel circuit 1700 includes a photodiode PD, a transfer transistor SWt, a reset transistor SWrst, a first temporal circuit 172a and a second temporal circuit 172b.

The first temporal circuit 172a includes a first capacitor (or storage capacitor) C1 and a second transistor SW2_R, which are respectively functioned similar to the elements C1 and SWa2 in FIG. 2 and thus details thereof are not repeated herein. The first capacitor C1 has a first end (e.g., left end shown in FIG. 17) coupled to the photodiode PD.

The first temporal circuit 172a further includes a first input transistor SWc1, as an inverting input terminal of a first comparator, connected to a second end (e.g., right end as shown in FIG. 17) of the first capacitor C1. The first comparator further includes a second input transistor SWc2 and transistors T1 and T2 arranged outside the pixel circuit 1700, and shared by the first temporal circuit 172a and other pixel circuits. The second input transistor SWc2 is used as a non-inverting input terminal of the first comparator.

The second temporal circuit 172b includes a second capacitor (or storage capacitor) C2 and a second transistor SW2_N, which are respectively functioned similar to the elements C2 and SWb2 in FIG. 2 and thus details thereof are not repeated herein. The second capacitor C2 has a first end (e.g., left end shown in FIG. 17) coupled to the photodiode PD.

The second temporal circuit 172b further includes a third input transistor SWc3, as an inverting input terminal of a second comparator, connected to a second end (e.g., right end as shown in FIG. 17) of the second capacitor C2. The second comparator further includes a fourth input transistor SWc4 and transistors T3 and T4 arranged outside the pixel circuit 1700, and shared by the second temporal circuit 172b and the other pixel circuits. The fourth input transistor SWc4 is used as a non-inverting input terminal of the second comparator.

The photodiode PD generates light energy, e.g., including $V_{REF}$ and $V_{NEW}$ shown in FIG. 16.

The transfer transistor SWt is connected between the photodiode PD and the first end of the first capacitor C1 as well as the first end of the second capacitor C2. As shown in FIG. 16, the transfer transistor SWt is used to transfer light energy (e.g., including $V_{REF}$ and $V_{NEW}$) in the first interval and the second interval to the first temporal circuit 172a (e.g., respectively shown as $V_{RESET}-V_{REF}$ and $V_{RESET}-V_{NEW}$ on the node $V_{FD}$), and transfer light energy (e.g., including $V_{NEW}$) in the second interval to the second temporal circuit 172b (e.g., shown as $V_{RESET}-V_{NEW}$ on the node $V_{FD}$).

The reset transistor SWrst is connected between the transfer transistor SWt and the first end of the first capacitor C1 as well as the first end of the second capacitor C2. The function of the reset transistor SWrst has been illustrated above, and thus is not repeated herein.

The second transistor SW2_R is connected between the first capacitor C1 and the first input transistor SWc1, wherein the second transistor SW2_R of the first temporal circuit 172a is not conducted in the second interval, as shown in FIG. 16 that the control signal AZ_R is at a low voltage level in the second interval. The second transistor SW2_N is connected between the second capacitor C2 and the third input transistor SWc3, wherein the second transistor SW2_N of the second temporal circuit 172b is not conducted in the first interval, as shown in FIG. 16 that the control signal AZ_N is at a low voltage level in the first interval.

In this embodiment, the first temporal circuit 172a is used to record a light energy variation of light energy detected by the photodiode PD between the first interval and the second interval, as shown in FIG. 16 when the transfer transistor SWt is conducted in the second interval, a voltage on the node $V_{G\_R}$ becomes $V_{AZ}+(V_{REF}-V_{NEW})$, wherein $V_{AZ}$ is a voltage on the node $V_{G\_R}$ in the reset interval. The second temporal circuit 172b is used to record detected light energy of the photodiode PD in the second interval, as shown in FIG. 16 in the read image data interval when the node $V_{FD}$ is reset to the voltage $V_{RESET}$, a voltage on the node $V_{G\_N}$ becomes $V_{AZ}+V_{NEW}$.

According to the input signal of the second input transistor SWc2, the pixel circuit 1700 operates in different modes, as shown in FIG. 11B and FIG. 11C. When the second input transistor SWc2 receives a ramp signal (e.g., shown in the read difference data interval in FIG. 16), the first temporal circuit 172a outputs a pulse width signal Tdiff corresponding to the light energy variation $(V_{REF}-V_{NEW})$. As mentioned above, it is possible that $(V_{REF}-V_{NEW})$ is a negative value, and a start point of the ramp signal is added by a voltage offset Voff.

When the second input transistor SWc2 sequentially receives a lower threshold voltage $V_{AZ}-$Vth and an upper threshold voltage $V_{AZ}+$Vth (e.g., shown in the difference check interval in FIG. 16), it is able to check whether the light energy variation $(V_{REF}-V_{NEW})$ exceeds the voltage threshold Vth. If $V_{AZ}+(V_{REF}-V_{NEW})$ does not exceed a range between the upper threshold voltage $V_{AZ}+$Vth and the lower threshold voltage $V_{AZ}-$Vth, the output signal $D_{diff}$ does not have a state change, and it means that the pixel circuit 1700 does not detect enough energy variation. If $V_{AZ}+(V_{REF}-V_{NEW})$ exceeds a range between the upper threshold voltage $V_{AZ}+$Vth and the lower threshold voltage $V_{AZ}-$Vth, the output signal $D_{diff}$ has a state change, and it means that the pixel circuit 1700 detects the energy variation, and the backend processor may perform the corresponding operations accordingly.

According to the input signal of the fourth input transistor SWc4, the pixel circuit 1700 operates in another mode, as shown in FIG. 11A. When the fourth input transistor SWc4 receives a ramp signal (e.g., shown in the read image data interval in FIG. 16), the second temporal circuit 172b outputs a pulse width signal Timage corresponding to the detected light energy $V_{NEW}$. Because the detected light energy $V_{NEW}$ is not a negative value since it is not differenced with any signal, no voltage offset Voff is required.

The pixel circuit 1700 of the present disclosure is suitable to the rolling shutter pixel array. Therefore, the first temporal circuit 172a further includes row selection transistors SWrs_R (e.g., shown two) connected between the first temporal circuit 172a and the first comparator. The row selection transistors SWrs_R are used to connect the first temporal circuit 172a to the first comparator according to a row selection signal RS. The second temporal circuit 172b further includes row selection transistors SWrs_N (e.g., shown two) connected between the second temporal circuit 172b and the second comparator. The row selection transistors SWrs_N are used to connect the second temporal circuit 172b to the second comparator according to the row selection signal RS.

The generating of a row selection signal for a rolling shutter pixel array is known to the art, and thus details thereof are not described herein.

Operations of the pixel circuit 1700 not described are referred to FIG. 16.

Figure 18:
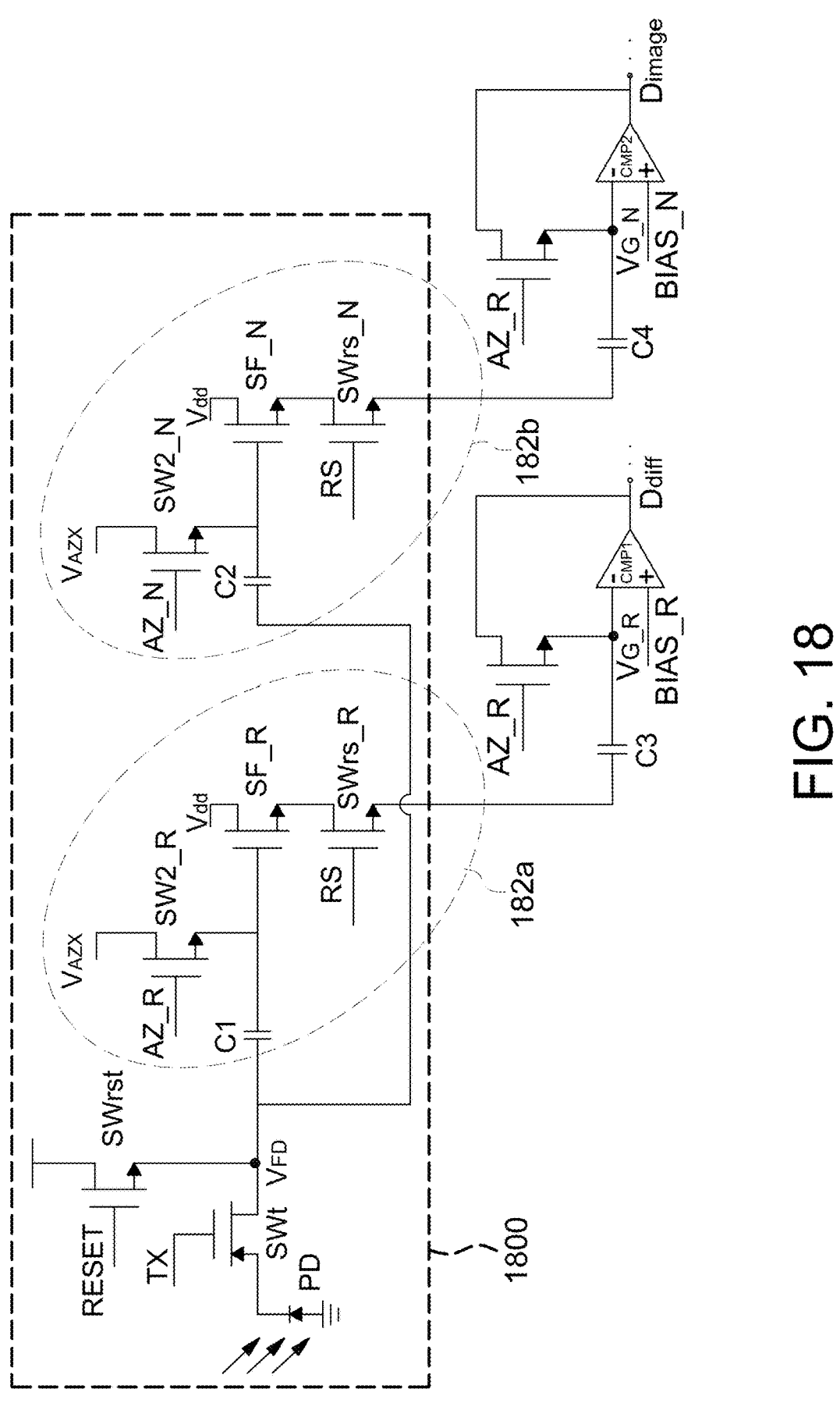
FIG. 18 is a circuit diagram of an alternative embodiment III of the present disclosure.

Please refer to FIG. 18, it is a circuit diagram of a pixel circuit 1800 according to an alternative embodiment of the present disclosure. The main difference from FIG. 17 is that the first comparator and the second comparator are all arranged outside the pixel circuit 1800 to be shared with other pixel circuits. Said other pixel circuits are multiple pixel circuits at the same column (e.g., same column of a pixel array shown in FIG. 14) as the pixel circuit 1800.

The signal timing diagram of the pixel circuit 1800 is also in FIG. 16.

The pixel circuit 1800 includes a photodiode PD, a transfer transistor SWt, a reset transistor SWrst, a first temporal circuit 182a and a second temporal circuit 182b.

The first temporal circuit 182a includes a first capacitor C1 and a second transistor SW2_R, which are respectively functioned similar to the elements C1 and SWa2 in FIG. 2 and thus details thereof are not repeated herein. The first capacitor C1 has a first end (e.g., left end shown in FIG. 18) coupled to the photodiode PD.

A second end (e.g., right end as shown in FIG. 18) of the first capacitor C1 in the first temporal circuit 182a is coupled to an inverting input terminal of a first comparator CMP1. The first comparator CMP1 is arranged outside the pixel circuit 1800, and shared by the first temporal circuit 182a and other pixel circuits.

The second temporal circuit 182b includes a second capacitor C2 and a second transistor SW2_N, which are respectively functioned similar to the elements C2 and SWb2 in FIG. 2 and thus details thereof are not repeated herein. The second capacitor C2 has a first end (e.g., left end shown in FIG. 18) coupled to the photodiode PD.

A second end (e.g., right end as shown in FIG. 18) of the second capacitor C2 in the second temporal circuit 182b is coupled to an inverting input terminal of a second comparator CMP2. The second comparator CMP2 is arranged outside the pixel circuit 1800, and shared by the second temporal circuit 182b and the other pixel circuits.

The photodiode PD generates light energy, e.g., including $V_{REF}$ and $V_{NEW}$ shown in FIG. 16.

The transfer transistor SWt is connected between the photodiode PD and the first end of the first capacitor C1 as well as the first end of the second capacitor C2. As shown in FIG. 16, the transfer transistor SWt is used to transfer light energy (e.g., including $V_{REF}$ and $V_{NEW}$) in the first interval and the second interval to the first temporal circuit 182a (e.g., respectively shown as $V_{RESET}-V_{REF}$ and $V_{RESET}-V_{NEW}$ on the node $V_{FD}$), and transfer light energy (e.g., including $V_{NEW}$) in the second interval to the second temporal circuit 182b (e.g., shown as $V_{RESET}-V_{NEW}$ on the node $V_{FD}$).

The reset transistor SWrst is connected between the transfer transistor SWt and the first end of the first capacitor C1 as well as the first end of the second capacitor C2. The function of the reset transistor SWrst has been illustrated above, and thus is not repeated herein.

The second transistor SW2_R is connected between the first capacitor C1 and the first comparator CMP1, wherein the second transistor SW2_R of the first temporal circuit 182a is not conducted in the second interval, as shown in FIG. 16 that the control signal AZ_R is at a low voltage level in the second interval. The second transistor SW2_N is connected between the second capacitor C2 and the comparator CMP2, wherein the second transistor SW2_N of the second temporal circuit 182b is not conducted in the first interval, as shown in FIG. 16 that the control signal AZ_N is at a low voltage level in the first interval.

In this embodiment, the first temporal circuit 182a is used to record a light energy variation of light energy detected by the photodiode PD between the first interval and the second interval, as shown in FIG. 16 when the transfer transistor SWt is conducted in the second interval, a voltage on the node $V_{G\_R}$ becomes $V_{AZ}+(V_{REF}-V_{NEW})$, wherein $V_{AZ}$ is a voltage on the node $V_{G\_R}$ in the reset interval. The second temporal circuit 182b is used to record detected light energy of the photodiode PD in the second interval, as shown in FIG. 16 in the read image data interval when the node $V_{FD}$ is reset to the voltage $V_{RESET}$, a voltage on the node $V_{G\_N}$ becomes $V_{AZ}+V_{NEW}$.

According to the input signal of a non-inverting input terminal of the first comparator CMP1, the pixel circuit 1800 operates in different modes, as shown in FIG. 11B and FIG. 11C. For example, when a non-inverting input terminal of the first comparator CMP1 receives a ramp signal (e.g., shown in the read difference data interval in FIG. 16), the first temporal circuit 182a outputs a pulse width signal Tdiff corresponding to the light energy variation $(V_{REF}-V_{NEW})$. As mentioned above, it is possible that $(V_{REF}-V_{NEW})$ is a negative value, and a start point of the ramp signal is added by a voltage offset Voff.

When the non-inverting input terminal of the first comparator CMP1 sequentially receives a lower threshold voltage $V_{AZ}-Vth$ and an upper threshold voltage $V_{AZ}+Vth$ (e.g., shown in the difference check interval in FIG. 16), it is able to check whether the light energy variation $(V_{REF}-V_{NEW})$ exceeds the voltage threshold Vth. If $V_{AZ}+(V_{REF}-V_{NEW})$ does not exceed a range between the upper threshold voltage $V_{AZ}+Vth$ and the lower threshold voltage $V_{AZ}-Vth$, the output signal $D_{diff}$ does not have a state change, and it means that the pixel circuit 1800 does not detect enough energy variation. If $V_{AZ}+(V_{REF}-V_{NEW})$ exceeds a range between the upper threshold voltage $V_{AZ}+Vth$ and the lower threshold voltage $V_{AZ}-Vth$, the output signal $D_{diff}$ has a state change, and it means that the pixel circuit 1800 detects the energy variation, and the backend processor may perform corresponding operations.

It should be mentioned that a sequence of inputting the upper threshold voltage and the lower threshold voltage is not particularly limited.

According to the input signal of a non-inverting input terminal of the second comparator CMP2, the pixel circuit 1800 operates in another mode, as shown in FIG. 11A. When the non-inverting input terminal of the second comparator CMP2 receives a ramp signal (e.g., shown in the read image data interval in FIG. 16), the second temporal circuit 182b outputs a pulse width signal Timage corresponding to the detected light energy $V_{NEW}$. Because the detected light energy $V_{NEW}$ is not a negative value since it is not differenced with any signal, no voltage offset Voff is required.

In order to allow a voltage on the first capacitor C1 to be losslessly buffered to the capacitor C3, the first temporal circuit 182a further includes a first source follower SF_R connected between the first capacitor C1 and the second transistor SW2_R as well as the first comparator CMP1. In order to allow a voltage on the second capacitor C2 to be losslessly buffered to the capacitor C4, the second temporal circuit 182b further includes a second source follower SF_N connected between the second capacitor C2 and the second transistor SW2_N as well as the second comparator CMP2.

The pixel circuit 1800 of the present disclosure is suitable to the rolling shutter pixel array. Therefore, the first temporal circuit 182a further includes a row selection transistor SWrs_R connected between the first source follower SF_R and the first comparator CMP1. The row selection transistor SWrs_R is used to connect the first source follower SF_R to the first comparator CMP1 according to a row selection signal RS. The second temporal circuit 182b further includes a row selection transistor SWrs_N connected between the second source follower SF_N and the second comparator CMP2. The row selection transistor SWrs_N is used to connect the second source follower SF_N to the second comparator CMP2 according to the row selection signal RS.

Operations of the pixel circuit 1800 not described are referred to FIG. 16.

In the alternative embodiment of FIG. 18, the first comparator CMP1 and the second comparator CP2 are arranged outside the pixel circuit 1800 to be shared with other pixel circuits. Therefore, in FIG. 16, operations of the first interval and the second interval are performed in the pixel circuit 1800, but operations of the output stage (i.e. conducting row selection transistors SWrs_R and SWrs_N), including reading difference data, difference checking and reading image data, are mainly performed outside the pixel circuit 1800.

That is, multiple pixel circuits 1800 of one pixel column sequentially use the comparators CMP1 or CMP2 to output a timing signal or a difference check signal according to the row selection signal RS.

Figure 19:
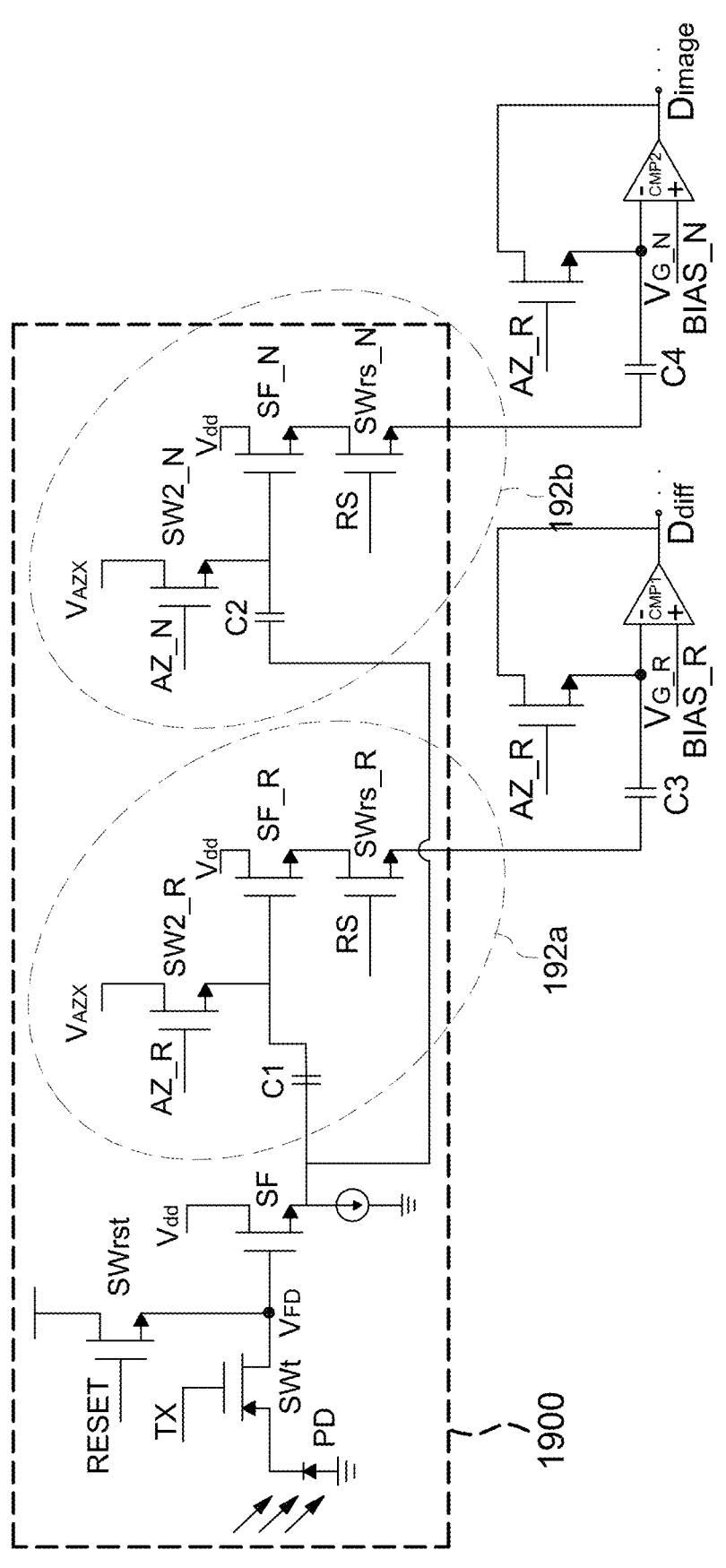
FIG. 19 is a circuit diagram of an alternative embodiment IV of the present disclosure.

Please refer to FIG. 19, it is a circuit diagram of a pixel circuit 1900 according to an alternative embodiment of the present disclosure. The main difference from FIG. 18 is that a source follower SF is further connected respectively between the transfer transistor SWt and the first capacitor C1 of the first temporal circuit 192a as well as the second capacitor C2 of the second temporal circuit 192b so as to losslessly buffer a voltage on the node $V_{FD}$ to the first capacitor C1 and the second capacitor C2 to improve the sensitivity and conversion gain of the pixel circuit.

Other parts of FIG. 19 are identical to FIG. 18 and operated as shown in FIG. 16, and thus details thereof are not repeated herein.

In this alternatively embodiment of FIG. 19, a second end of the first capacitor C1 is coupled to a non-inverting input terminal of the first comparator CMP1, which is arranged outside the pixel circuit 1900 and shared by the first temporal circuit 192a and other pixel circuits. A second end of the second capacitor C2 is coupled to a non-inverting input terminal of the second comparator CMP2, which is arranged outside the pixel circuit 1900 and shared by the second temporal circuit 192b and the other pixel circuits. Said other pixels are multiple pixel circuits at the same column (e.g., same column in a pixel array of FIG. 14) as the pixel circuit 1900.

It should be mentioned that operations of the pixel circuits 1500, 1700, 1800 and 1900 are applied to every pixel of a pixel array, e.g., shown in FIG. 14.

It should be mentioned that since locations of recording the time difference data and the image data are exchanged, it is possible the first temporal circuit records the image data and the second temporal circuit records the difference data in the first cycle.

It should be mentioned that one component inside the pixel circuit described herein is referred to that every pixel circuit in a pixel array has the one component, and one component outside the pixel circuit described herein is referred to that one pixel column in the pixel array shares the one component.

As mentioned above, in the conventional optical sensor, pixel data is converted to digital data at first, and then the digital data is operated by the digital backend such that frame buffers are required to temporarily store frame data. Accordingly, the present disclosure further provides a pixel circuit that outputs pulse width signals for the analog operation (e.g., FIG. 2 and FIGS. 5 to 7). The pixel circuit outputs, within an operation interval, the PW signals corresponding to different detecting intervals for the analog operation of an operation circuit so as to realize the objective of the pixel-wise operation of pixel data.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:
1. An operating method of a pixel circuit,
the pixel circuit comprising:
  a photodiode, configured to generate light energy;
  a transfer transistor;
  a first node, configured to store the light energy from the photodiode via the transfer transistor;
  a first temporal circuit, comprising a first capacitor having a first end coupled to the first node and a second end coupled to a second node in the first temporal circuit; and
  a second temporal circuit, comprising a second capacitor having a first end coupled to the first node and a second end coupled to a third node in the second temporal circuit;
the operation method comprising:
  exposing the photodiode and resetting the first node and the second node in a first interval;
  transferring first light energy generated by the photodiode in the first interval to the first node via the transfer transistor in a second interval to cause the first node to have a first voltage offset;
  exposing the photodiode, resetting the first node and floating the first capacitor in a third interval to cause the second node to be increased by the first voltage offset;

transferring second light energy generated by the photodiode in the third interval to the first node via the transfer transistor in a fourth interval to cause the first node to have a second voltage offset and cause the second node to be further decreased by the second voltage offset; and resetting the first node and floating the second capacitor in a fifth interval to cause the third node to be increased by the second voltage offset.

2. The operating method as claimed in claim 1, further comprising:

keeping the second node at the resetting state in the second interval; and keeping the first capacitor at the floating state in the fourth interval.

3. The operating method as claimed in claim 1, wherein the first voltage offset is corresponding to the first light energy generated by the photodiode in the first interval, and the second voltage offset is corresponding to the second light energy generated by the photodiode in the third interval, which is different from the first interval.

4. The operating method as claimed in claim 1, wherein the second temporal circuit further comprising a first transistor coupled between a voltage source and an output node of the second temporal circuit, and a second transistor coupled between the third node and the output node, the operating method further comprises:

providing a ramp signal as a control signal of the first transistor to cause the second temporal circuit to output a pulse width signal corresponding to the second light energy as image data in the fifth interval.

5. The operating method as claimed in claim 4, further comprising:

in a next first interval and a next second interval behind the fifth interval, recording new image data in the first temporal circuit.

6. The operating method as claimed in claim 4, further comprising:

turning off the second transistor to float the second capacitor in the fifth interval.

7. An operating method of a pixel circuit, the pixel circuit comprising:

a photodiode, configured to generate light energy;

a transfer transistor;

a first node, configured to store the light energy from the photodiode via the transfer transistor;

a first temporal circuit, comprising a first capacitor having a first end coupled to the first node and a second end coupled to a second node in the first temporal circuit; and a second temporal circuit, comprising a second capacitor having a first end coupled to the first node and a second end coupled to a third node in the second temporal circuit;

the operation method comprising:

exposing the photodiode and resetting the first node and the second node in a first interval;

transferring first light energy generated by the photodiode in the first interval to the first node via the transfer transistor in a second interval to cause the first node to have a first voltage offset;

exposing the photodiode, resetting the first node and floating the first capacitor in a third interval to cause the second node to be increased by the first voltage offset;

transferring second light energy generated by the photodiode in the third interval to the first node via the transfer transistor in a fourth interval to cause the first node to have a second voltage offset and cause the second node to be further decreased by the second voltage offset; and controlling the first temporal circuit to output a pulse width signal corresponding to a difference between the first light energy and the second light energy in a fifth interval.

8. The operating method as claimed in claim 7, wherein keeping the second node at the resetting state in the second interval; and keeping the first capacitor at the floating state in the fourth interval.

9. The operating method as claimed in claim 7, wherein the first voltage offset is corresponding to the first light energy generated by the photodiode in the first interval, and the second voltage offset is corresponding to the second light energy generated by the photodiode in the third interval, which is different from the first interval.

10. The operating method as claimed in claim 7, wherein the first temporal circuit further comprising a first transistor coupled between a voltage source and an output node of the first temporal circuit, and a second transistor coupled between the second node and the output node, the operating method further comprises:

providing a ramp signal as a control signal of the first transistor to cause the first temporal circuit to output the pulse width signal in the fifth interval.

11. The operating method as claimed in claim 10, further comprising:

adding an offset voltage to a start voltage of the ramp signal to avoid a negative difference between the first light energy and the second light energy.

12. The operating method as claimed in claim 10, further comprising:

resetting the third node in the fifth interval.

13. The operating method as claimed in claim 7, further comprising:

in a next first interval and a next second interval behind the fifth interval, recording a new difference between a new first light energy and the second light energy in the second temporal circuit.

14. An operating method of a pixel circuit, the pixel circuit comprising:

a photodiode, configured to generate light energy;

a transfer transistor;

a first node, configured to store the light energy from the photodiode via the transfer transistor;

a first temporal circuit, comprising a first capacitor having a first end coupled to the first node and a second end coupled to a second node in the first temporal circuit; and a second temporal circuit, comprising a second capacitor having a first end coupled to the first node and a second end coupled to a third node in the second temporal circuit;

the operation method comprising:

exposing the photodiode and resetting the first node and the second node in a first interval;

transferring first light energy generated by the photodiode in the first interval to the first node via the transfer transistor in a second interval to cause the first node to have a first voltage offset;

exposing the photodiode, resetting the first node and floating the first capacitor in a third interval to cause the second node to be increased by the first voltage offset;

transferring second light energy generated by the photodiode in the third interval to the first node via the transfer transistor in a fourth interval to cause the first node to have a second voltage offset and cause the second node to be further decreased by the second voltage offset; and identifying whether to read the third node of the second temporal circuit according to a voltage on the second node of the first temporal circuit.

15. The operating method as claimed in claim 14, further comprising:

keeping the second node at the resetting state in the second interval; and keeping the first capacitor at the floating state in the fourth interval.

16. The operating method as claimed in claim 14, wherein the first voltage offset is corresponding to the first light energy generated by the photodiode in the first interval, and the second voltage offset is corresponding to the second light energy generated by the photodiode in the third interval, which is different from the first interval.

17. The operating method as claimed in claim 14, wherein the first temporal circuit further comprising a first transistor coupled between a voltage source and an output node of the first temporal circuit, a second transistor coupled between the second node and the output node and an inverter coupled behind the output node, the operating method further comprises:

providing a threshold voltage as a control signal of the first transistor to be compared with the voltage on the second node to determine whether there is a state change outputted by the inverter.

18. The operating method as claimed in claim 17, further comprising:

reading a voltage on the third node of the second temporal circuit when the state change occurs.

19. The operating method as claimed in claim 18, wherein the voltage on the third node is image data corresponding to the second light energy.

20. The operating method as claimed in claim 17, further comprising:

not reading a voltage on the third node of the second temporal circuit when there is no state change.

* * * * *